United States Patent
Himeno et al.

(10) Patent No.: US 9,627,695 B2
(45) Date of Patent: Apr. 18, 2017

(54) ELECTRICAL CONDUCTIVE MEMBER, METHOD FOR MANUFACTURING THE SAME, SEPARATOR FOR FUEL CELL, AND POLYMER ELECTROLYTE FUEL CELL

(75) Inventors: Tomokatsu Himeno, Yokohama (JP); Keisuke Yamamoto, Chigasaki (JP); Atsushi Miyazawa, Kamakura (JP); Motoki Yaginuma, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 631 days.

(21) Appl. No.: 13/810,298

(22) PCT Filed: Jul. 14, 2011

(86) PCT No.: PCT/JP2011/066113
§ 371 (c)(1),
(2), (4) Date: Feb. 14, 2013

(87) PCT Pub. No.: WO2012/008534
PCT Pub. Date: Jan. 19, 2012

(65) Prior Publication Data
US 2013/0209917 A1 Aug. 15, 2013

(30) Foreign Application Priority Data
Jul. 16, 2010 (JP) .................... 2010-161610

(51) Int. Cl.
*H01M 8/0202* (2016.01)
*C23C 14/02* (2006.01)
(Continued)

(52) U.S. Cl.
CPC ........... *H01M 8/0202* (2013.01); *B32B 9/007* (2013.01); *B32B 15/043* (2013.01); *B32B 15/20* (2013.01);
(Continued)

(58) Field of Classification Search
CPC ............ H01M 8/0228; H01M 8/0258; H01M 8/0202; B32B 9/007; B32B 15/043; C23C 14/025; C23C 14/0605
(Continued)

(56) References Cited

U.S. PATENT DOCUMENTS 5,059,297 A 10/1991 Hirao et al.
6,821,624 B2 * 11/2004 Utsumi et al. ............. 204/192.1
(Continued)

FOREIGN PATENT DOCUMENTS

EP 1 231 655 A1 8/2002
JP 64-052329 A 2/1989
(Continued)

*Primary Examiner* — Ula C Ruddock
*Assistant Examiner* — Thomas Parsons
(74) *Attorney, Agent, or Firm* — Foley & Lardner LLP

(57) ABSTRACT

An electrical conductive member (20) includes a metal substrate (21), an intermediate layer (23) formed on the metal substrate (21), and an electrical conductive layer (25) formed on the intermediate layer (23). The intermediate layer (23) contains a constituent of the metal substrate (21), a constituent of the electrical conductive layer (25), and a crystallization inhibiting component that inhibits crystallization in the intermediate layer (23). According to this configuration, the electrical conductive member having excellent electrical conductivity and resistance to corrosion can be obtained.

14 Claims, 13 Drawing Sheets

(51) Int. Cl.
*C23C 14/06* (2006.01)
*C23C 14/34* (2006.01)
*C23C 14/35* (2006.01)
*H01M 8/0206* (2016.01)
*H01M 8/0228* (2016.01)
*B32B 9/00* (2006.01)
*B32B 15/04* (2006.01)
*B32B 15/20* (2006.01)
*H01M 8/1018* (2016.01)

(52) U.S. Cl.
CPC .......... *C23C 14/022* (2013.01); *C23C 14/025* (2013.01); *C23C 14/0605* (2013.01); *C23C 14/34* (2013.01); *C23C 14/35* (2013.01); *H01M 8/0206* (2013.01); *H01M 8/0228* (2013.01); *B32B 2307/202* (2013.01); *B32B 2307/702* (2013.01); *B32B 2307/704* (2013.01); *B32B 2307/714* (2013.01); *B32B 2605/00* (2013.01); *H01M 2008/1095* (2013.01); *Y02P 70/56* (2015.11)

(58) Field of Classification Search
USPC .............. 429/457, 514; 204/192.17; 427/115
See application file for complete search history.

(56) References Cited

U.S. PATENT DOCUMENTS

| | | | |
|---|---|---|---|
| 7,364,814 | B2 | 4/2008 | Nakata et al. |
| 7,851,107 | B2 | 12/2010 | Nakata |
| 2003/0228510 | A1 | 12/2003 | Nakata et al. |
| 2008/0160390 | A1 | 7/2008 | Nakata |
| 2010/0151358 | A1 | 6/2010 | Sato et al. |
| 2011/0287336 | A1* | 11/2011 | Himeno et al. ............... 429/492 |

FOREIGN PATENT DOCUMENTS

| | | |
|---|---|---|
| JP | 02-247393 A | 10/1990 |
| JP | 2004-014208 A | 1/2004 |
| JP | 2004-185998 A | 7/2004 |
| JP | 2005-005088 A | 1/2005 |
| JP | 2005-197062 A | 7/2005 |
| JP | 2008-210773 A | 9/2008 |
| JP | 2008-218037 A | 9/2008 |
| JP | 2009-289707 A | 12/2009 |
| JP | 2010-129464 A | 6/2010 |
| JP | 2010-153353 A | 7/2010 |
| WO | WO 01/06585 A1 | 1/2001 |

* cited by examiner (a) [ELECTRICAL CONDUCTIVE MEMBER A]
R=1.0~1.2
BIAS VOLTAGE=0V (b) [ELECTRICAL CONDUCTIVE MEMBER B]
R=1.6
BIAS VOLTAGE=-140V

ELECTRICAL CONDUCTIVE MEMBER, METHOD FOR MANUFACTURING THE SAME, SEPARATOR FOR FUEL CELL, AND POLYMER ELECTROLYTE FUEL CELL

TECHNICAL FIELD

The present invention relates to an electrical conductive member, a method for manufacturing the same, a separator for a fuel cell, and a polymer electrolyte fuel cell. More specifically, the present invention relates to an electrical conductive member including a metal substrate, a prescribed intermediate layer formed on the metal substrate and an electrical conductive layer formed on the inter mediate layer, a method for manufacturing the electrical conductive member, and a separator for a fuel cell and a polymer electrolyte fuel cell using the same.

BACKGROUND ART

Polymer electrolyte fuel cells (PEFC) have a stacked structure constituted by a plurality of single cells that exert a power generation function. Each of the single cells has a membrane electrode assembly (MEA) including (I) a polymer electrolyte membrane, (II) a pair of a anode catalyst layer and a cathode catalyst layer (electrode catalyst layers) that interpose the polymer electrolyte membrane therebetween, and (III) a pair of an anode gas diffusion layer and a cathode gas diffusion layer that interpose the electrode catalyst layers therebetween and disperse supply gas. The MEA in one single cell is electrically connected to another MEA in the adjacent single cell via a separator. Thus, a fuel cell stack is constituted by the single cells that are stacked on top of each other.

The fuel cell stack described above functions as a power generation means available for various purposes. In the fuel cell stack, the separator functions to electrically connect the adjacent single cells to each other as described above. In addition, the surface of the separator facing the MEA is generally provided with gas flow paths. The gas flow paths function as gas supply means to supply fuel gas and oxidant gas to an anode and a cathode, respectively.

The following is a brief explanation of a power generation mechanism of the PEFC. During the operation of the PEFC, fuel gas (such as hydrogen gas) is supplied to an anode side of the single cells, and oxidant gas (such as air and oxygen) is supplied to a cathode side. As a result, electrochemical reactions represented by the following reaction formulae proceed at the anode side and the cathode side, respectively, so as to generate electricity.

Anode side: $H_2 \rightarrow 2H^+ + 2e^-$ (1)

Cathode side: $2H^+ + 2e^- + (½)O_2 \rightarrow H_2O$ (2)

A separator constituted by metal has relatively high intensity compared with a carbon separator and an electrical conductive resin separator. Therefore, the thickness of the metal separator can be reduced to some extent. In addition, since the metal separator has excellent electrical conductivity, there is an advantage of reducing contact resistance to the MEA. However, the metal separator has a possibility of a decrease in electrical conductivity caused by corrosion derived from produced water and a potential difference caused during the operation, and a possibility of a reduction in power in the stack in association with the decrease in electrical conductivity. Therefore, the metal separator is required to have improved resistance to corrosion while the excellent electrical conductivity is ensured.

There has been a known method of forming an oxide film on a substrate of a metal separator so as to be provided between the substrate and an electrical conductive thin film (for example, Patent Document 1). According to such a method, it is possible to obtain a separator for a fuel cell that can ensure electrical conductivity and suppress dissolution of metal constituting the substrate and has excellent durability. In addition, Patent Document 1 discloses that an intermediate layer for improvement in adhesion is provided between the oxide film of the substrate and the electrical conductive thin film. Thus, adhesion between the oxide film of the substrate and the electrical conductive thin film can be improved. Here, the intermediate layer is prepared by a sputtering method.

CITATION LIST

Patent Literature

Patent Document 1: Japanese Patent Unexamined Publication No. 2004-185998

SUMMARY OF INVENTION

However, in the method described in Patent Document 1, there has been a problem of a decrease in electrical conductivity in the thickness direction of the separator since the oxide film itself provided on the surface of the substrate has a high insulation property.

The present invention has been made in view of the above-described conventional problems. It is an object of the present invention to provide an electrical conductive member having excellent electrical conductivity and high resistance to corrosion, a method for manufacturing the electrical conductive member, and a separator for a fuel cell and a polymer electrolyte fuel cell using the same.

An electrical conductive member according to a first aspect of the present invention comprises: a metal substrate; an intermediate layer formed on the metal substrate; and an electrical conductive layer formed on the intermediate layer. The intermediate layer contains a constituent of the metal substrate, a constituent of the electrical conductive layer, and a crystallization inhibiting component that inhibits crystallization in the intermediate layer.

A method for manufacturing an electrical conductive member according to a second aspect of the present invention comprises: removing an oxide film on a surface of a metal substrate; forming an intermediate layer on the metal substrate after removing the oxide film; and forming an electrical conductive layer on the intermediate layer after forming the intermediate layer. In the forming the intermediate layer, the intermediate layer is formed to contain a constituent of the metal substrate, a constituent of the electrical conductive layer, and a crystallization inhibiting component that inhibits crystallization in the intermediate layer.

DESCRIPTION OF EMBODIMENTS

Figure 1:
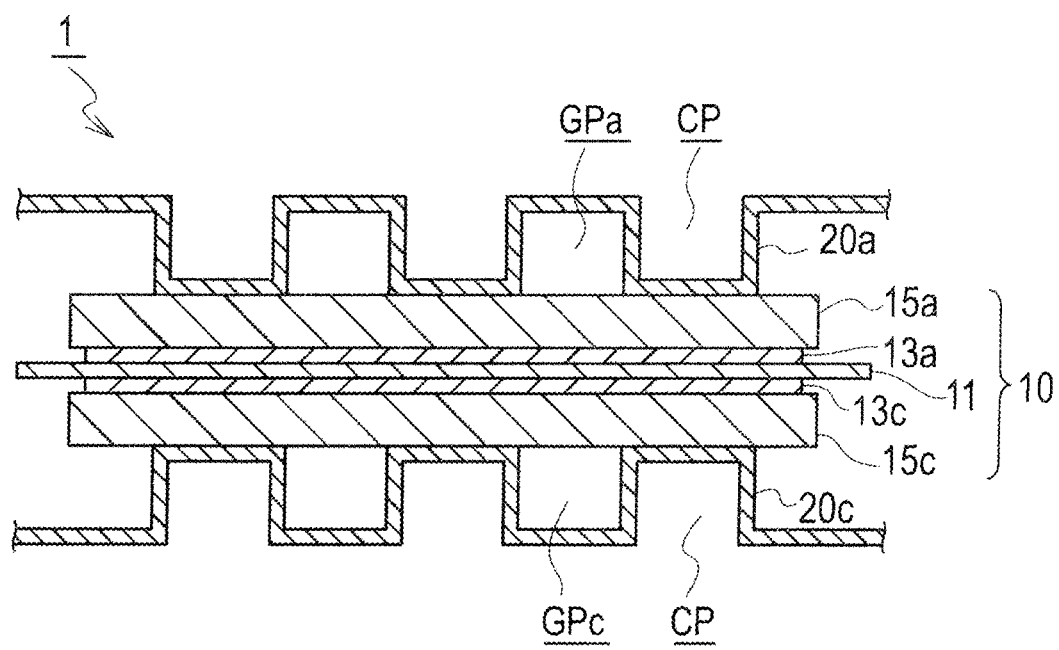
FIG. 1 is a cross-sectional view showing an example of a polymer electrolyte fuel cell (PEFC) according to an embodiment of the present invention.

A description will be made below in detail of an electrical conductive member, a method for manufacturing the electrical conductive member, a separator for a fuel cell and a polymer electrolyte fuel cell according to the present invention with reference to the drawings. Note that the dimensional ratios in the drawings are inflated for convenience of explanation, and may be different from the actual ratios.

<Electrical Conductive Member and Separator for Fuel Cell>

The electrical conductive member according to the present invention includes a metal substrate, an intermediate layer formed on the metal substrate, and an electrical conductive layer formed on the intermediate layer. The intermediate layer contains a constituent of the metal substrate, a constituent of the electrical conductive layer, and a crystallization inhibiting component that inhibits crystallization in the intermediate layer.

In general, a metal substrate in a separator for a fuel cell is prepared from iron (Fe), titanium (Ti), aluminum (Al), copper (Cu), or alloys thereof. Although the metal substrate exerts resistance to corrosion to some extent, the metal substrate is corroded by water with time if subjected to electric potential for a long period of time. Thus, an improvement in resistance to corrosion has been an issue in the metal substrate. It has been suggested in Patent Document 1 that the surface of the metal substrate is covered with an oxide film so as not to allow water to reach the metal substrate. In addition, an intermediate layer is provided between the oxide film of the metal substrate and the electrical conductive layer by use of a sputtering method in order to increase adhesion therebetween. In Patent Document 1, when the intermediate layer is formed by the sputtering method, the intermediate layer shows a columnar structure having high crystalline orientation and as a result, large amounts of gaps between crystals are caused. Thus, it is difficult to prevent water from passing therethrough. Accordingly, the oxide film having a high insulation property cannot be removed from the metal substrate in view of the resistance to corrosion.

On the other hand, in the present embodiment, the intermediate layer containing the constituent of the metal substrate, the constituent of the electrical conductive layer, and the crystallization inhibiting component for inhibiting crystallization in the intermediate layer is provided between the metal substrate from which the oxide film is removed and the electrical conductive layer. As a result, adhesion between the metal substrate and the electrical conductive layer is ensured. Although water, for example, produced on the electrode side in the fuel cell may penetrate through the electrical conductive layer, defects such as pinholes are reduced significantly in the intermediate layer in which crystallization is inhibited. Therefore, the water hardly penetrates through the intermediate layer, and water molecules hardly pass through the intermediate layer. Namely, the metal substrate is hardly subjected to water. Accordingly, the electrical conductive member according to the present embodiment is not damaged by corrosion due to water even if being subjected to electrical potential for a long period of time. Thus, excellent electrical conductivity and high resistance to corrosion can be achieved.

Here, it is assumed that a mechanism for the significant reduction of the defects such as pinholes due to the crystallization inhibiting component is as follows. The element that is the crystallization inhibiting component disorders an atomic arrangement in a crystal structure composed of the constituent of the metal substrate and the constituent of the electrical conductive layer. As a result, crystallinity is decreased, which leads to an amorphous structure. Therefore, crystal grain boundaries themselves are decreased, and the defects such as pinholes which are caused easily from the crystal grain boundaries can be reduced significantly. Note that this mechanism is only based on the presumption. Thus, even if the above-described effect is obtained by other mechanisms, the other mechanisms are included in the scope of the present invention.

FIG. 1 is a cross-sectional view showing an example of a schematic constitution of the polymer electrolyte fuel cell (PEFC) according to the present embodiment. A PEFC 1 includes a polymer electrolyte membrane 11, and a pair of catalyst layer (an anode catalyst layer 13a and a cathode catalyst layer 13c) that interpose the polymer electrolyte membrane 11 therebetween. A stacked body constituted by the polymer electrolyte membrane 11 and the catalyst layers 13a and 13c is interposed between a pair of gas diffusion layers (GDL) (an anode gas diffusion layer 15a and a cathode gas diffusion layer 15c). Thus, the polymer electrolyte membrane 11, the pair of the catalyst layers 13a and 13c and the pair of the gas diffusion layers 15a and 15c are stacked to constitute a membrane electrode assembly (MEA) 10.

In the PEFC 1, the MEA 10 is further interposed between a pair of separators (an anode separator 20a and a cathode separator 20c). FIG. 1 shows that the separators 20a and 20c are provided on both sides of the MEA 10. In general, in a fuel cell stack constituted by plural MEAs stacked on top of each other, each separator is provided for adjacent PEFCs so that the PEFCs are separated from each other. In other words, the fuel cell stack is constituted in such a manner that the MEAs are stacked sequentially interposing the separators. In the actual fuel cell stack, gas seal members are provided between the separators 20a and 20c and the polymer electrolyte membrane 11, and between the PEFC 1 and the adjacent PEFC 1. However, the gas seal members are not shown in FIG. 1.

The separators 20a and 20c have a concave-convex configuration as shown in FIG. 1 formed in such a manner that a thin plate having a thickness of, for example, 0.5 mm or less is subjected to press processing. Convex portions of the separators 20a and 20c as viewed from the MEA 10 are in contact with the MEA 10. Thus, an electrical connection between the separators 20a and 20c and the MEA 10 is obtained. Concave portions of the separators 20a and 20c as viewed from the MEA 10 are spaces between the separators and the MEA derived from the concave-convex configuration of the separators, and serve as gas flow paths through which gas flows during the operation of the PEFC 1. In particular, fuel gas (for example, hydrogen) flows through gas flow paths GPa of the anode separator 20a, and oxidant gas (for example, air) flows through gas flow paths GPc of the cathode separator 20c.

Concave portions of the separators 20a and 20c as viewed from the opposite side of the MEA serve as refrigerant flow paths CP through which a refrigerant (for example, water) flows to cool the PEFC during the operation of the PEFC 1. In general, separators are provided with manifolds (not shown in the figure). The manifolds function as connection means for connecting single cells to each other when constituting a stack. According to the above-described configuration, a mechanical strength of the fuel cell stack can be ensured.

Figure 2:
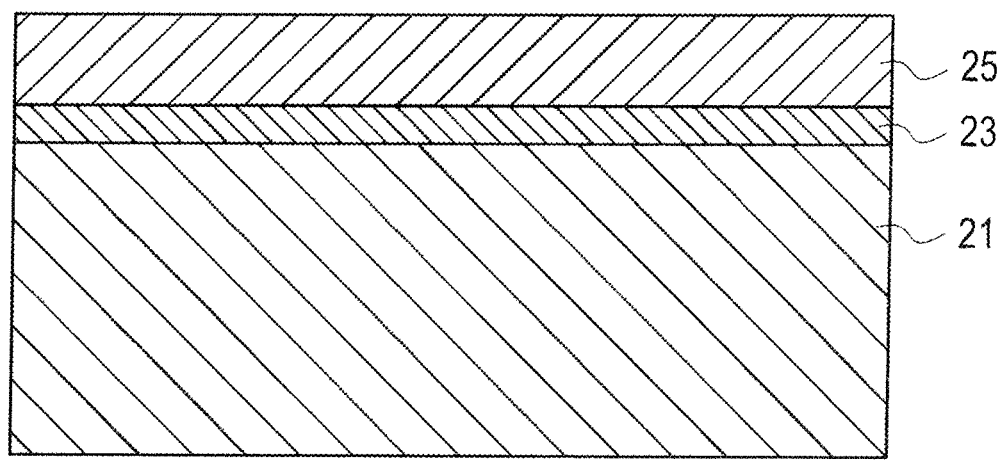
FIG. 2 is a cross-sectional view showing an example of an electrical conductive member according to the embodiment of the present invention.

FIG. 2 is a cross-sectional view showing a schematic constitution of a surface part of the separator 20 in FIG. 1. That is, the cross-section in FIG. 2 shows an example of a schematic constitution of the electrical conductive member according to the present embodiment. As shown in FIG. 2, the electrical conductive member constituting the separator 20 includes a metal substrate 21, an intermediate layer 23 formed directly on the metal substrate 21, and an electrical conductive layer 25 formed directly on the intermediate layer 23. The intermediate layer 23 contains a constituent of the metal substrate 21, a constituent of the electrical conductive layer 25 and a crystallization inhibiting component that inhibits crystallization in the intermediate layer 23. The following is a specific explanation of each element of the electrical conductive member (the separator 20) according to the present embodiment.

[Metal Substrate]

The metal substrate 21 constitutes the electrical conductive member (the separator 20), and contributes to ensuring electrical conductivity and mechanical strength. The metal substrate 21 may be constituted by an arbitrary material that is conventionally used as a constituent material for metal separators. Examples of the constituent material of the metal substrate include iron (Fe), titanium (Ti), aluminum (Al) and alloys thereof. These materials are preferably used in terms of mechanical strength, general versatility, cost performance and workability. Here, an iron alloy includes stainless steel. In particular, the metal substrate is preferably constituted by stainless steel, aluminum or an aluminum alloy. When stainless steel is used for the metal substrate, sufficient electrical conductivity in a contact surface with a gas diffusion substrate as a constituent member for the gas diffusion layer can be obtained.

Examples of the aluminum alloy include pure aluminum series, aluminum-manganese series, and aluminum-magnesium series. Other elements other than aluminum in the aluminum alloy are not particularly limited as long as the elements are generally applicable to the aluminum alloy. For example, copper (Cu), manganese (Mn), silicon (Si), magnesium (Mg), zinc (Zn) and nickel (Ni) may be included in the aluminum alloy. As specific examples of the aluminum alloy, A1085P and A1050P standardized according to Japanese Industrial Standards may be used as pure aluminum series. As aluminum-manganese series, A3003P and A3004P may be used. As aluminum-magnesium series, A5052P and A5083P may be used. Here, alloy refining may be performed as appropriate in addition to the alloy type deteimination described above since the separator for a fuel cell is required to have a mechanical strength and formability. When the metal substrate 21 is constituted by a simple body such as titanium and aluminum, a purity of titanium and aluminum is preferably 95% by mass or higher, more preferably 97% by mass or higher, even more preferably 99% by mass or higher.

Examples of stainless steel include austenite series, martensite series, ferrite series, austenite-ferrite series, and precipitation hardening series. As austenite series, SUS201, SUS202, SUS301, SUS302, SUS303, SUS304, SUS305, SUS316(L) and SUS317 standardized according to Japanese Industrial Standards may be used. As austenite-ferrite series. SUS329J1 may be used. As martensite series, SUS403 and SUS420 may be used. As ferrite series, SUS405. SUS430 and SUS430LX may be used. As precipitation hardening series. SUS630 may be used. It is more preferable to use stainless steel of austenite series such as SUS304 and SUS316. A content ratio of iron (Fe) in stainless steel is preferably in the range from 60% to 84% by mass, more preferably in the range from 65% to 72% by mass. In addition, a content ratio of chromium (Cr) in stainless steel is preferably in the range from 16% to 20% by mass, more preferably in the range from 16% to 18% by mass.

The thickness of the metal substrate 21 is not particularly limited. For example, when the metal substrate 21 is used for the separator for a fuel cell, the thickness is preferably in the range from 50 µm to 500 µm in view of workability, mechanical strength, and improvement in energy density of the fuel cell in order to reduce the thickness of the separator itself. The thickness of the metal substrate 21 is more preferably in the range from 80 µm to 300 µm, even more preferably in the range from 80 µm to 200 µm. In particular, when aluminum is used for the constituent material, the thickness of the metal substrate 21 is preferably in the range from 100 μm to 300 μm. When stainless steel is used for the constituent material, the thickness of the metal substrate 21 is preferably in the range from 80 μm to 150 μm. When the thickness of the metal substrate 21 is within the above-mentioned range, the separator having high workability and a desired thickness can be obtained while maintaining sufficient strength for the separator.

[Intermediate Layer]

The intermediate layer 23 is provided on the metal substrate 21. Due to the presence of the intermediate layer, it is possible to improve adhesion between the metal substrate 21 and the electrical conductive layer 25. Further, it is possible to prevent water, for example, produced in the electrodes of the fuel cell, from penetrating the metal substrate 21. Accordingly, the electrical conductive member (the separator 20) can have excellent electrical conductivity and high resistance to corrosion due to the presence of the intermediate layer 23 compared with an electrical conductive member including a metal substrate, an oxide film, an intermediate layer and an electrical conductive thin film. Since the intermediate layer in the present embodiment preliminarily contains the constituent of the electrical conductive layer, adverse effects caused by dispersion of the constituent of the electrical conductive layer into the intermediate layer can be minimized.

In order to inhibit crystallization in the intermediate layer, the intermediate layer preferably has at least one of an amorphous structure and a quasi-crystalline structure having a crystallite diameter smaller than that of each of the metal substrate and the electrical conductive layer. Since those structures can prevent defects such as pinholes which are caused easily from crystal grain boundaries, water molecules produced on the electrode side in the fuel cell hardly penetrate through the intermediate layer. Note that, in the present Description, "an amorphous structure" is a structure in which atoms or molecules are assembled without forming crystals having a regular spatial arrangement. Such a structure may be defined as an amorphous structure when no peak is observed by a measurement of an X-ray diffractometer. Further, in the present Description, "the intermediate layer having a quasi-crystalline structure" means that the intermediate layer has a crystallite diameter smaller than that of each of the metal substrate and the electrical conductive layer. Note that "a crystallite diameter" means a crystallite size calculated by use of Scherrer's equation in X-ray diffraction.

The intermediate layer having the above-described structure is generally in a state in which the three constituents described above are mixed (dispersed) in the layer and therefore, crystallization is easily prevented. The contents of the constituents in the intermediate layer are preferably higher on the metal substrate side in order to prevent the constituent of the metal substrate from entering the electrical conductive layer in view of the improvement in resistance to corrosion.

In the case in which the intermediate layer has the amorphous structure or the quasi-crystalline structure, the method of forming the intermediate layer is not particularly limited. For example, the intermediate layer may be formed in such a manner that an average crystallite diameter in the intermediate layer is smaller than that in each of the metal substrate and the electrical conductive layer.

The size relationship between the average crystallite diameter in the intermediate layer and the average crystallite diameter in each of the metal substrate and the electrical conductive layer is not particularly limited as long as crystallization in the intermediate layer is inhibited. A ratio $(D_2/D_1)$ of the average crystallite diameter $[D_1$ (nm)$]$ in each of the metal substrate and the electrical conductive layer to the average crystallite diameter $[D_2$ (nm)$]$ in the intermediate layer is preferably equal to or larger than 0.1 and smaller than 1, more preferably in the range from 0.1 to 0.5. When the ratio is within such a range, crystallization in the intermediate layer can be inhibited to the extent that the water molecules substantially do not reach the metal substrate. The average crystallite diameters in the respective layers are also not particularly limited as long as the size relationship described above is fulfilled. In the present Description, "the average crystallite diameter" was measured by an X-ray diffractometer manufactured by Mac Science Corporation. The average crystallite diameter in the intermediate layer $[D_2$ (nm)$]$ is preferably in the range from 10 nm to 30 nm, more preferably in the range from 10 nm to 20 nm.

The material constituting the intermediate layer is not particularly limited as long as the material contains the constituent of the metal substrate, the constituent of the electrical conductive layer and the crystallization inhibiting component that inhibits crystallization in the intermediate layer. In particular, examples of the constituent of the metal substrate include iron (Fe), titanium (Ti), aluminum (Al), and alloys thereof. Examples of the constituent of the electrical conductive layer include chromium (Cr), titanium (Ti), copper (Cu), iron (Fe), nickel (Ni), silver (Ag), gold (Au), tin (Sn) and carbon (C). Examples of the crystallization inhibiting component include an element in Group 18 such as helium (He), argon (Ar) and krypton (Kr), and an element such as boron (B), phosphorus (P), silicon (Si), carbon (C) and germanium (Ge).

The constituent of the electrical conductive layer is preferably a constituent other than the main component of the metal substrate in view of the improvement in electrical conductivity. Here, the main component means that the content of the component is 50% by mass or higher. Further, the electrical conductive layer preferably contains metal having little ion elusion such as chromium (Cr) and titanium (Ti), or a nitride, a carbide or a carbonitride thereof. More preferably, the electrical conductive layer containing chromium or titanium, or a carbide or a nitride thereof is used. When the metal having little ion elusion or the carbide or the nitride thereof is used, the resistance to corrosion in the separator can be improved significantly.

The crystallization inhibiting component is capable of conversion to the amorphous structure in the intermediate layer without loss of the functions of the metal substrate and the electrical conductive layer, or capable of micronization in the intermediate layer in such a manner that the crystallite diameter in the intermediate layer is smaller than that in each of the metal substrate and the electrical conductive layer. For example, when argon is present, the atomic arrangement in the intermediate layer in which the three constituents are mixed together is disordered and as a result, crystallinity is decreased and the amorphous structure is easily obtained. If the constituents of the metal substrate and the electrical conductive layer react with the crystallization inhibiting component to produce a compound, compound crystals are caused and the amorphous structure cannot be easily obtained. Thus, the crystallization inhibiting component is preferably selected from components that hardly produce the compound together with the constituents of the metal substrate and the electrical conductive layer. In addition, when a lattice constant of the crystallization inhibiting component is close to that of each constituent of the metal substrate and the electrical conductive layer, the effect of disordering the crystalline structure is decreased. Therefore, it is preferable to use a component having a lattice constant which is largely different from that of each constituent of the metal substrate and the electrical conductive layer. Further, the crystallization inhibiting component preferably has an atomic radius larger than that of each constituent in the metal substrate and the electrical conductive layer in view of the improvement in electrical conductivity and resistance to corrosion.

The content ratio of the crystallization inhibiting component in the intermediate layer 23 is not particularly limited, but is preferably in the range from 1 to 10 atom %. When the content ratio of the crystallization inhibiting component is within the above-described range, excellent electrical conductivity and high resistance to corrosion can be achieved.

The thickness of the intermediate layer 23 is not particularly limited. However, the thickness of the intermediate layer 23 is preferably in the range from 20 nm to 200 nm in view of minimization of the size of the fuel cell stack when using the electrical conductive member for the separator for a fuel cell. When the thickness of the intermediate layer 23 is within the above-described range, high electrical conductivity in the intermediate layer 23 can be maintained. The thickness of the intermediate layer 23 within such a range also contributes to the effect of elusion prevention of the constituent of the metal substrate.

The hardness of the intermediate layer 23 is not particularly limited, but preferably between the hardness of the metal substrate and the hardness of the electrical conductive layer. When the hardness of the intermediate layer 23 is within such a range, a hardness difference between the interfaces of the layers can be minimized as much as possible. Thus, distortion in the metal substrate, the intermediate layer and the electrical conductive layer due to film stress when using the electrical conductive member for the separator for a fuel cell is evenly caused. Accordingly, the intermediate layer 23 can ensure high adhesion to the metal substrate and the electrical conductive layer. In particular, the hardness of the intermediate layer 23 is preferably in the range from 100 Hv to 1000 Hv in terms of Vickers hardness. Here, "Vickers hardness (Hv)" is a value defining a hardness degree of a substance, and a value inherent in the substance. In the present Description, the Vickers hardness represents a value measured by a nanoindentation method. The nanoindentation method is a method for continuously applying and releasing load by use of a diamond indenter with micro load with respect to sample surfaces, so as to measure hardness from obtained load-displacement curves. As the degree of Hv is higher, the substance becomes harder.

In the present embodiment, the entire metal substrate 21 is covered with the intermediate layer 23. In other words, an area ratio (a coverage) in the metal substrate 21 covered with the intermediate layer 23 is 100%. However, the coverage may be less than 100%. The coverage in the metal substrate 21 covered with the intermediate layer 23 is preferably 60% or higher, more preferably in the range from 80% to 100%, even more preferably in the range from 90% to 100%, most preferably 100%. According to this constitution, water molecules are prevented from penetrating through exposed areas in the metal substrate 21 not covered with the intermediate layer 23, and a reduction in electrical conductivity and resistance to corrosion in the electrical conductive member (in particular, the metal substrate) is suppressed effectively.

Note that the coverage represents an area ratio in the metal substrate 21 overlapping with the intermediate layer 23 when the electrical conductive member is viewed from the stacking direction.

The surface of the intermediate layer 23 on the electrical conductive layer 25 side is preferably roughened at a nano level. Due to this configuration, adhesion of the electrical conductive layer 25 to the intermediate layer 23 can be further improved. As described below, at least the outermost surface of the electrical conductive layer 25 is preferably an electrical conductive carbon layer, and an intensity ratio R ($I_D/I_G$) of a peak intensity ($I_D$) of D-band to a peak intensity ($I_G$) of G-band measured by a Raman scattering spectroscopic analysis in the carbon layer preferably exceeds 2.0. Accordingly, the adhesion effect between the intermediate layer 23 and the electrical conductive layer 25 may be achieved prominently.

[Electrical Conductive Layer]

The electrical conductive layer 25 is provided on the intermediate layer 23. Examples of the electrical conductive layer 25 include a metal layer and an electrical conductive carbon layer constituted by carbon. Examples of the material constituting the metal layer include chromium (Cr), titanium (Ti), copper (Cu), iron (Fe), nickel (Ni), silver (Ag), gold (Au) and tin (Sn). The electrical conductive carbon layer contains electrical conductive carbon. In particular, the metal layer containing noble metal such as gold (Au) and silver (Ag) and the electrical conductive carbon layer which have high electrical conductivity and high resistance to corrosion in a fuel cell environment (1 to 1.2 V) are preferably used. In view of reduction in the used amount of noble metal and a reduction in cost, the electrical conductive layer preferably has a stacked structure composed of the metal layer and the electrical conductive carbon layer. Due to the presence of the electrical conductive carbon layer, the resistance to corrosion is further improved while ensuring electrical conductivity of the electrical conductive member compared with the case not containing the electrical conductive carbon layer. The preferred embodiment in the case of using the electrical conductive carbon layer in the electrical conductive layer 25 is described below.

There have been proposals for a method of providing a carbon layer containing graphitized carbon on the surface of a metal separator substrate. A fuel cell separator including such a carbon layer obtains improved corrosion resistance and electrical conductivity. However, since the carbon layer does not always have the same crystalline structure, the levels of corrosion resistance and electrical conductivity of the separator itself vary depending on the crystalline structure of the carbon layer. Thus, such a conventional fuel cell separator did not have sufficient corrosion resistance and electrical conductivity. On the other hand, when the electrical conductive carbon layer has a particular crystalline structure, an electrical conductive path from one side to the other side of the electrical conductive carbon layer can be obtained. Due to the presence of the electrical conductive carbon layer in the electrical conductive member (in particular, the separator), excellent electrical conductivity and corrosion resistance can be ensured. In other words, the crystalline structure of the electrical conductive carbon layer is defined by the intensity ratio R ($I_D/I_G$) of the D-band peak intensity ($I_n$) to the G-band peak intensity ($I_G$), which is measured by the Raman scattering spectroscopic analysis. In particular, the intensity ratio R ($I_D/I_G$) is preferably 1.3 or higher. The following is a specific explanation of the conditions for such a structure.

When a carbon material is analyzed by Raman spectroscopy, peaks usually appear in the vicinity of 1350 cm$^{-1}$ and 1584 cm$^{-1}$. High crystalline graphite has a single peak in the vicinity of 1584 cm$^{-1}$. This peak is usually referred to as "G-band". On the other hand, as crystallinity is decreased, in the other words, as defects of the crystalline structure are increased and the structure of graphite is disordered, a peak appears in the vicinity of 1350 cm$^{-1}$, which is usually referred to as "D-band". A peak of diamond is precisely 1333 cm$^{-1}$, which is distinct from the D-band. The intensity ratio R ($I_D/I_G$) of the D-band peak intensity ($I_D$) to the G-band peak intensity ($I_G$) is used as an index of a size of graphite clusters of the carbon material, a disordered level of the graphite structure (defects of the crystal structure), and an sp$^2$ bond ratio. That is, in the present embodiment, the intensity ratio R may be regarded as an index of contact resistance of the electrical conductive carbon layer, and used as a film parameter for controlling electrical conductivity of the electrical conductive carbon layer.

In order to calculate the R ($I_D/I_G$) value, Raman spectrum of the carbon material is measured by use of a Micro-Raman spectroscope. In particular, a relative intensity ratio (peak area ratio ($I_D/I_G$)) of the peak intensity ($I_D$) in the range from 1300 to 1400 cm$^{-1}$ referred to as D-band to the peak intensity ($I_G$) in the range from 1500 to 1600 cm$^{-1}$ referred to as G-band is calculated.

As described above, the R value according to the present embodiment is preferably 1.3 or higher. This R value is more preferably in the range from 1.4 to 2.0, even more preferably in the range from 1.4 to 1.9, particularly preferably in the range from 1.5 to 1.8. When the R value is 1.3 or higher, the electrical conductive carbon layer having sufficient electrical conductivity in the stacking direction of the electrical conductive carbon layer can be obtained. Moreover, when the R value is 2.0 or lower, a reduction of a graphite component can be suppressed. In addition, an increase in inner stress of the electrical conductive carbon layer itself can be suppressed, so that adhesion to the intermediate layer as a base material can be further improved.

A mechanism to obtain the above-described effect by setting the R value at 1.3 or higher according to the present embodiment is assumed as follows. Note that this mechanism is only based on the presumption. Thus, even if the above-described effect is obtained by other mechanisms, the other mechanisms are included in the scope of the present invention.

Figure 3:
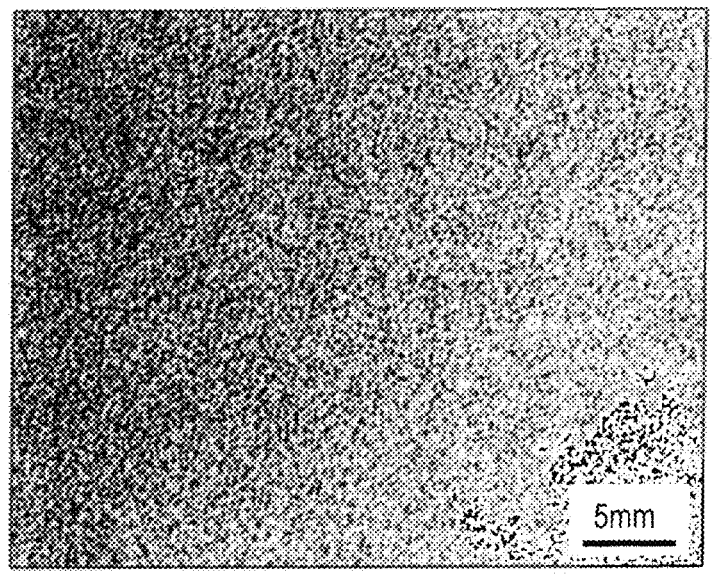
FIG. 3(a) is a photograph (magnification: 400 thousand) of a cross-section of an electrical conductive member A having an electrical conductive layer with R=1.0 to 1.2 observed with a transmission electron microscope (TEM).
FIG. 3(b) is a photograph (magnification: 400 thousand) of a cross-section of an electrical conductive member B having an electrical conductive layer with R=1.6 observed with the TEM.
Figure 3:
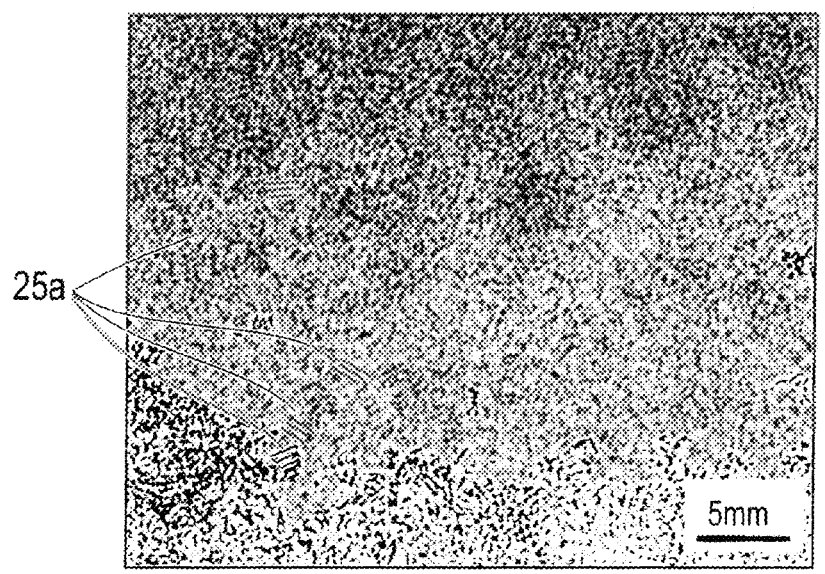

As described above, the increase of the intensity of the D-band peak (that is, the increase of the R value) represents an increase of defects of the crystal structure in the graphite structure. In other words, the increase of the intensity of the D-band peak represents an increase of sp$^3$ carbon in high crystalline graphite constituted approximately only by sp$^2$ carbon. FIG. 3(a) shows a photograph (magnification: 400 thousand) of a cross-section of the electrical conductive member (electrical conductive member A) having the electrical conductive carbon layer with R=1.0 to 1.2 observed with a transmission electron microscope (TEM). Similarly, FIG. 3(b) shows a photograph (magnification: 400 thousand) of a cross-section of the electrical conductive member (electrical conductive member B) having the electrical conductive carbon layer with R=1.6 observed with TEM. The electrical conductive members A and B were prepared by using SUS316L as the metal substrate, and providing the intermediate layer (thickness: 0.2 µm) containing Cr and the electrical conductive carbon layer (thickness: 0.2 µm) sequentially on the surface of the metal substrate by the sputtering method. Bias voltage applied to the metal substrate at the time of providing the electrical conductive carbon layer in the electrical conductive member A is 0 V. Bias voltage applied to the metal substrate at the time of providing the electrical conductive carbon layer in the electrical conductive member B is −140 V.

As can be seen from FIG. 3(b), the electrical conductive carbon layer in the electrical conductive member B has a polycrystalline graphite structure. Namely, a number of graphite clusters 25a are present in the electrical conductive member B. On the other hand, such a polycrystalline graphite structure is not confirmed in the electrical conductive carbon layer in the electrical conductive member A.

Microscopically, "polycrystalline graphite" has an anisotropic graphite crystal structure (graphite clusters) in which graphene planes (hexagonal planes) are stacked. Macroscopically, on the other hand, the polycrystalline graphite has an isotropic crystalline body in which a number of the graphite structures are aggregated. Therefore, the polycrystalline graphite can be regarded as a kind of diamond-like carbon (DLC). In general, monocrystalline graphite has an orderly structure in which graphene planes are stacked, even macroscopically, as represented by highly oriented pyrolytic graphite (HOPG). On the other hand, the polycrystalline graphite includes the graphite structures as individual clusters, and has disordered layer structures. By adjusting the R value to the above-mentioned value, the disordered level (the amount and size of graphite clusters) is moderately maintained, so as to ensure an electrical conductive path from one side to the other side of the electrical conductive carbon layer. It is conceivable that a reduction in electrical conductivity caused by individual provision of the electrical conductive carbon layer in addition to the metal substrate is prevented.

In the polycrystalline graphite, since the graphene planes are formed by the connection of the sp$^2$ carbon atoms constituting the graphite clusters, electrical conductivity is ensured in the plane direction of the graphene planes. In addition, the polycrystalline graphite is substantially constituted only by carbon atoms, has a small specific surface area, and has a small amount of connected functional groups. Therefore, the polycrystalline graphite has excellent resistance to corrosion caused by acidic water. Also in powder of carbon black, primary particles are usually constituted by the aggregation of the graphite clusters and therefore, electrical conductivity is exerted. However, since individual particles are separated, a large number of functional groups are formed on the surface of the polycrystalline graphite. Therefore, corrosion is easily caused by acidic water and the like. Even if the electrical conductive carbon layer is formed by carbon black, there is a problem of a deficiency in density as a protect film.

In the case of constituting the electrical conductive carbon layer according to the present embodiment by the polycrystalline graphite, the size of the graphite clusters constituting the polycrystalline graphite is not particularly limited. For example, an average diameter of the graphite clusters is preferably in the range from 1 nm to 50 nm, more preferably in the range from 2 nm to 10 nm. When the average diameter of the graphite clusters is in such a range, an increase in thickness of the electrical conductive carbon layer can be prevented while the crystal structure of the polycrystalline graphite is maintained. The "diameter" of the respective graphite clusters represents a maximum distance among arbitrary two-point distances on the outline of the respective graphite clusters. The average diameter of the graphite clusters is calculated as an average value of the diameters of the graphite clusters observed in several to several tens of visual fields by use of an observing means such as a scanning electron microscope (SEM) and a transmission electron microscope (TEM).

In the present embodiment, the electrical conductive carbon layer may be constituted only by the polycrystalline graphite. However, the electrical conductive carbon layer may include other materials other than the polycrystalline graphite. Examples of the carbon materials other than the polycrystalline graphite that may be contained in the electrical conductive carbon layer include carbon black, fullerene, carbon nanotube, carbon nanofiber, carbon nanohorn, and carbon fibril. Specific examples of carbon black include Ketjen black, acetylene black, channel black, lamp black, oil furnace black, and thermal black. Carbon black may be subjected to a graphitizing treatment. Examples of the materials other than the carbon materials that may be contained in the electrical conductive carbon layer include noble metal such as gold (Au), silver (Ag), platinum (Pt), ruthenium (Ru), palladium (Pd), rhodium (Rh), and indium (In). Other examples include a water-repellent substance such as polytetrafluoroethylene, and an electrical conductive oxide. With regard to the materials other than the polycrystalline graphite, only one of them may be used, or two or more of them may be combined.

The thickness of the electrical conductive carbon layer is not particularly limited, but preferably in the range from 1 nm to 1000 nm, more preferably in the range from 2 nm and 500 nm, even more preferably in the range from 5 nm to 200 nm. When the thickness of the electrical conductive carbon layer is in such a range, sufficient electrical conductivity between the gas diffusion substrate and the separator for a fuel cell using the electrical conductive member can be obtained, and the metal substrate can have high resistance to corrosion. In the present embodiment, the intermediate layer 23 and the electrical conductive layer 25 are provided only on one main surface of the metal substrate 21. However, the intermediate layer 23 and the electrical conductive layer 25 may also be provided on the other main surface of the metal substrate 21.

The further preferred embodiment of the electrical conductive layer 25 according to the present embodiment is explained below; however, the scope of the present invention is not limited to the embodiment described below.

With regard to Raman scattering spectroscopic analysis of the electrical conductive carbon layer, when the electrical conductive layer 25 includes the electrical conductive carbon layer, an average peak measured by a rotational anisotropy measurement of the Raman scattering spectroscopic analysis preferably shows a twofold symmetry pattern. The following is a brief explanation of a measurement principle of the rotational anisotropy measurement.

Figure 4:
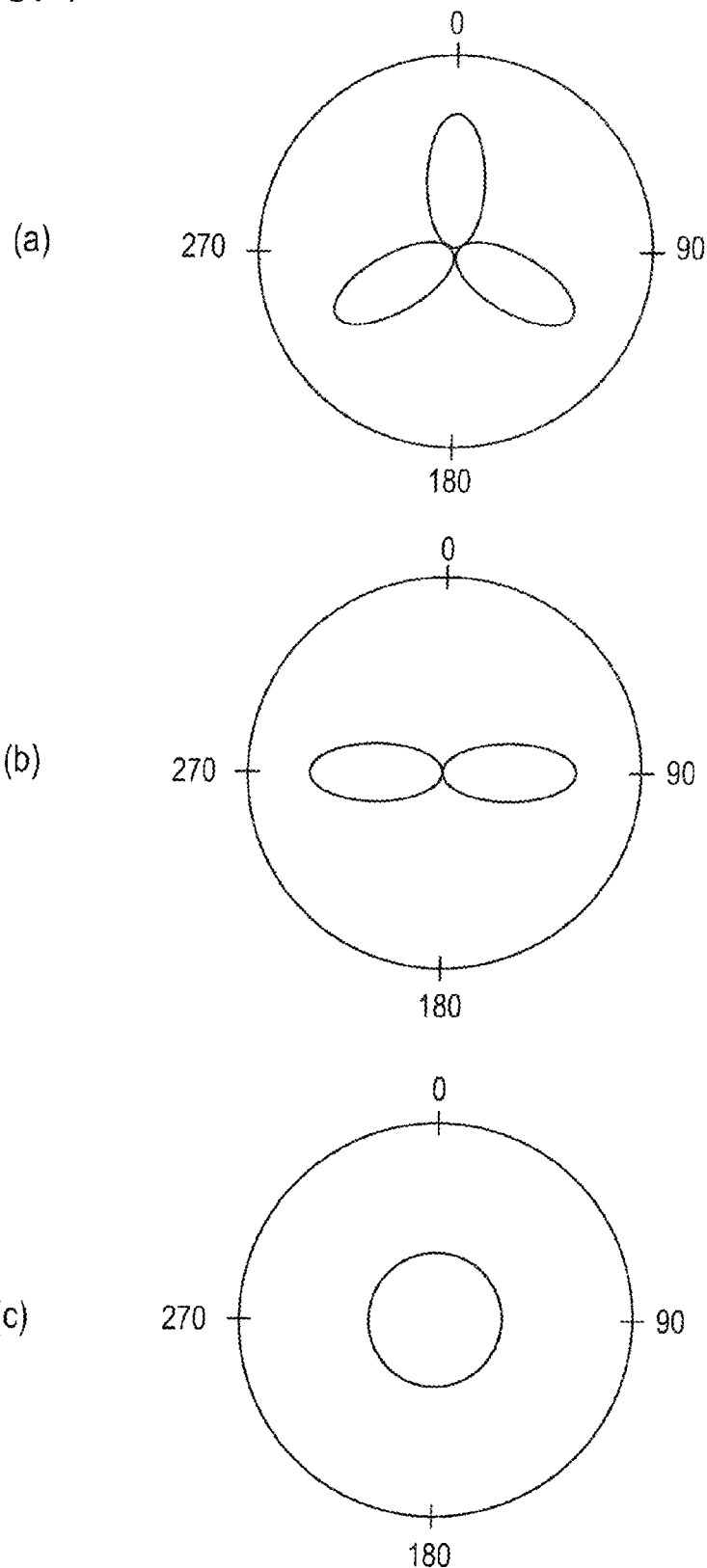
FIG. 4(a) is a typical view showing a threefold symmetry pattern of an average peak in a rotational anisotropy measurement of a Raman scattering spectroscopic analysis.
FIG. 4(b) is a typical view showing a twofold symmetry pattern of an average peak.
FIG. 4(c) is a typical view without symmetry pattern of an average peak.

The rotational anisotropy measurement of the Raman scattering spectroscopic analysis is carried out according to a Raman scattering spectroscopic measurement while a measurement sample is rotated 360 degrees in a horizontal direction. In particular, the surface of the measurement sample is subjected to laser irradiation to measure normal Raman spectrum. Then, the measurement sample is rotated 10 degrees to measure the Raman spectrum in a similar manner. This operation is repeated until the measurement sample is rotated 360 degrees. Then, an average value of the peak intensities obtained at the respective degrees is calculated, and the calculated average value is represented in polar coordinates of 360 degrees in which the peak intensity is zero in the center. Thus, the average peak can be obtained. For example, when a graphite layer is present in the sample surface in such a manner that graphene planes are parallel to the plane direction of the sample, a threefold symmetry pattern as shown in FIG. 4(a) is observed. When a graphite layer is present in the sample surface in such a manner that graphene planes are perpendicular to the plane direction of the sample, a twofold symmetry pattern as shown in FIG. 4(b) is observed. When an amorphous carbon layer with no definite crystal structure is present in the sample surface, a pattern with no symmetry as shown in FIG. 4(c) is observed. Therefore, when the average peak measured by the rotational anisotropy measurement shows the twofold symmetry pattern, the plane direction of the graphene planes constituting the electrical conductive carbon layer approximately corresponds to the stacking direction of the electrical conductive carbon layer. Thus, such a configuration is preferable because electrical conductivity in the electrical conductive carbon layer is ensured by the shortest path.

Figure 5:
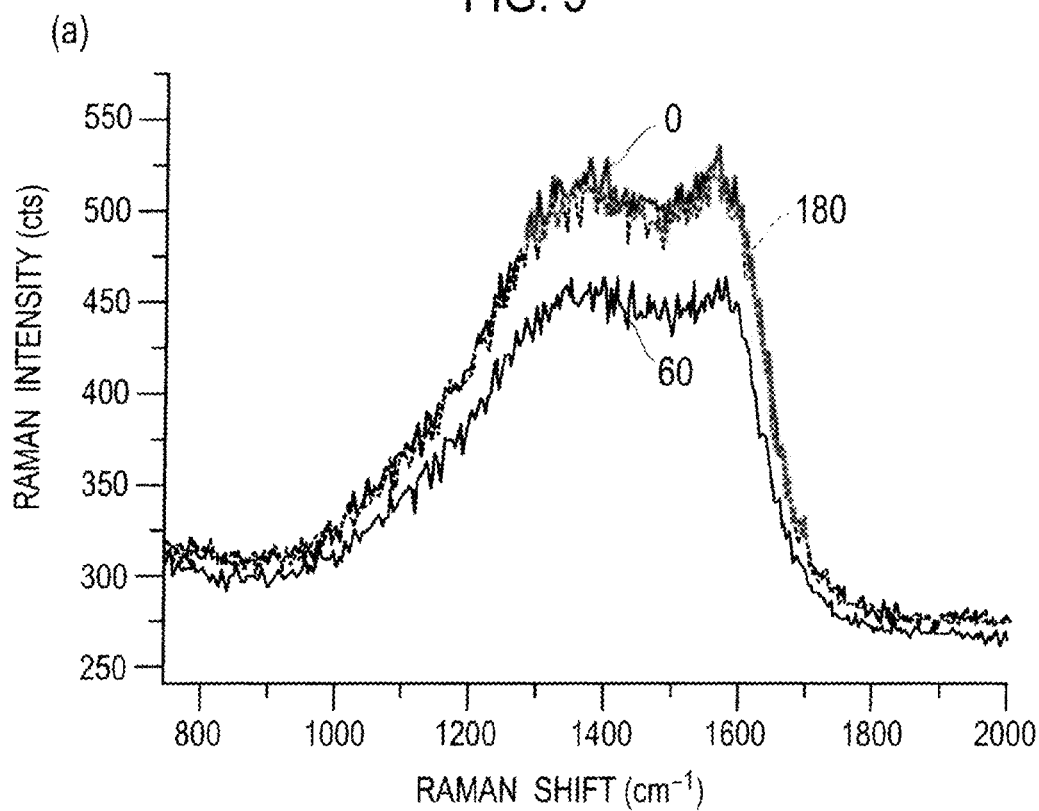
FIG. 5(a) is a graph showing Raman spectra using the electrical conductive member B as a measurement sample measured at rotation degrees of 0°, 60° and 180°, respectively.
FIG. 5(b) is a graph showing an average peak in a rotational anisotropy measurement for the electrical conductive member B.
Figure 5:
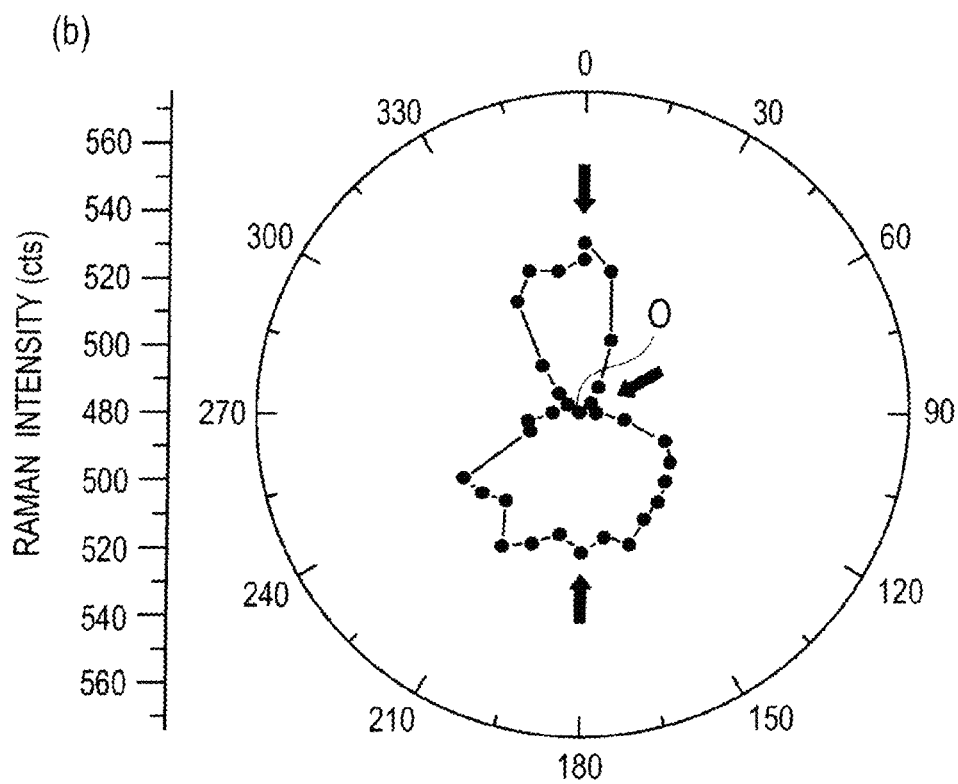

FIG. 5(a) and FIG. 5(b) show the results of the rotational anisotropy measurement. FIG. 5(a) shows Raman spectra when the electrical conductive member B is used as a measurement sample, in which the rotation degrees of the sample are 0°, 60° and 180°. FIG. 5(b) shows an average peak of the rotational anisotropy measurement with regard to the electrical conductive member B obtained by the above-mentioned method. As shown in FIG. 5(b), the peaks appeared at 0° and 180° in the rotational anisotropy measurement of the electrical conductive member B. This corresponds to the twofold symmetry pattern shown in FIG. 4(b). In the present Description, "to show the twofold symmetry pattern" means that there are two 180-degree opposite peaks based on the reference point of which the peak intensity is zero in the average peak. This definition is available since the peak intensity shown in the threefold symmetry pattern and the peak intensity shown in the twofold symmetry pattern are considered to have a similar value in principle.

The hardness of the electrical conductive layer 25 is not particularly limited. However, the Vickers hardness of the electrical conductive layer 25 is preferably 1500 Hv or lower, more preferably 1200 Hv or lower, even more preferably 1000 Hv or lower, particularly preferably 800 Hv or lower. When the Vickers hardness meets the above-mentioned values, excessive incorporation of $sp^3$ carbon with no electrical conductivity is suppressed, and a reduction in electrical conductivity in the electrical conductive layer 25 can be prevented. Although the minimum value of the Vickers hardness is not particularly limited, it is possible to sufficiently ensure the hardness of the electrical conductive layer 25 when the Vickers hardness is 50 Hv or higher. Accordingly, the electrical conductive member can be provided in which the electrical conductive layer has a resistance to external contact or impact such as friction and has excellent adhesion to the other layers. In view of these points, the Vickers hardness of the electrical conductive layer 25 is more preferably 80 Hv or higher, even more preferably 100 Hv or higher, particularly preferably 200 Hv or higher.

Figure 6:
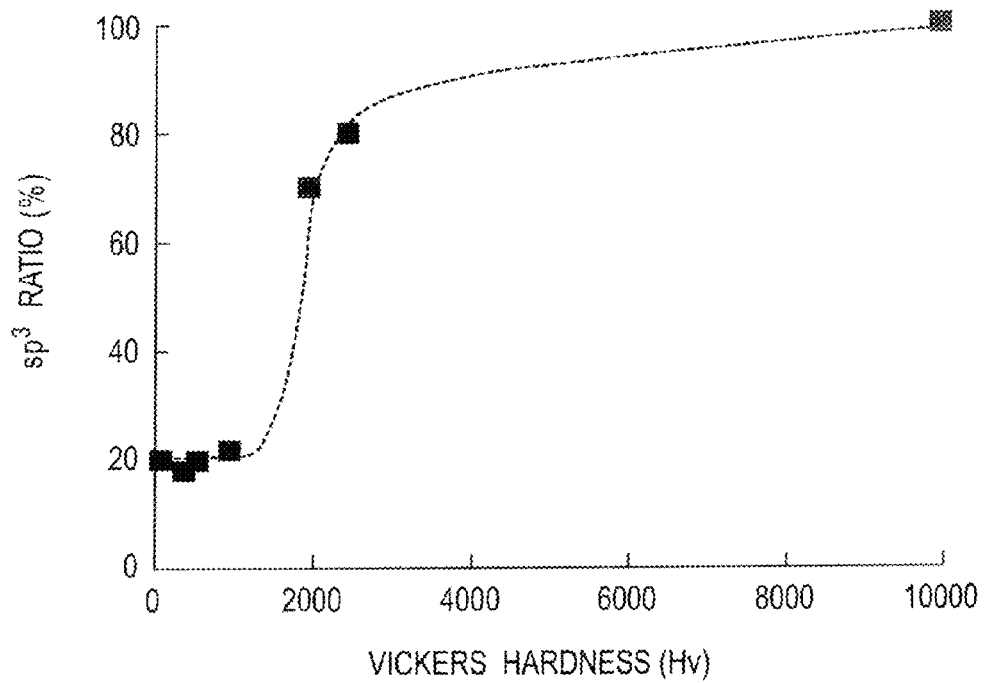
FIG. 6 is a graph showing a relationship between Vickers hardness of an electrical conductive carbon layer and an $sp^a$ ratio value of the electrical conductive carbon layer in an electrical conductive member, in which the Vickers hardness of the electrical conductive carbon layer is varied with a change of a bias voltage and a film formation system using a sputtering method.

Here, SUS316L was prepared as the metal substrate 21 of the electrical conductive member. The intermediate layer constituted by Cr (thickness of 0.2 μm) and the electrical conductive carbon layer (thickness of 0.2 μm) were formed sequentially on the surface of the metal substrate 21 by the sputtering method. In this case, by controlling the bias voltage and film formation system, the Vickers hardness of the electrical conductive carbon layer was changed. FIG. 6 shows a relationship between the Vickers hardness of the electrical conductive carbon layer in the electrical conductive member thus obtained and the $sp^3$ ratio value. In FIG.

6, diamond shows the $sp^3$ ratio=100% and 10000 Hv. According to the result shown in FIG. 6, it is recognized that the $sp^3$ ratio is greatly decreased when the Vickers hardness of the electrical conductive carbon layer is 1500 Hv or lower. In addition, it is assumed that the contact resistance of the electrical conductive member is decreased as the $sp^3$ ratio value is decreased.

From the other viewpoint, it is preferable to take into consideration the content of hydrogen atoms contained in the electrical conductive carbon layer. That is, when the hydrogen atoms are contained in the electrical conductive carbon layer, the hydrogen atoms are bonded to carbon atoms. As a result, a hybrid orbital of the carbon atoms to which the hydrogen atoms are bonded shifts from $sp^2$ to $sp^3$ to lose electrical conductivity. Accordingly, the electrical conductivity of the electrical conductive carbon layer 25 is reduced. Moreover, when C—H bonds in the polycrystalline graphite are increased, bond continuity is lost and the hardness of the electrical conductive layer 25 is decreased. Consequently, a mechanical strength and corrosion resistance of the electrical conductive member are decreased. In view of these issues, the content of the hydrogen atoms in the electrical conductive layer 25 is preferably 30 atom % or lower, more preferably 20 atom % or lower, even more preferably 10 atom % or lower with respect to the total atoms constituting the electrical conductive layer 25. With regard to the content of the hydrogen atoms in the electrical conductive layer 25, a value obtained by an elastic recoil detection analysis (ERDA) is used. In this method, by inclining the measurement sample to pass a helium ion beam shortly thereinto, elements that are pushed to the front side are detected. Since atomic nuclei of the hydrogen atoms are lighter than the incident helium ions, the atomic nuclei of the hydrogen atoms are pushed to the front side when the hydrogen atoms are present. Since such diffusion is elastic diffusion, energy spectrum of the recoiled atoms reflects a mass of the atomic nuclei. Thus, the number of the atomic nuclei of the recoiled hydrogen atoms is measured by use of a solid state detector, so that the content of the hydrogen atoms in the measurement sample is obtained.

Figure 7:
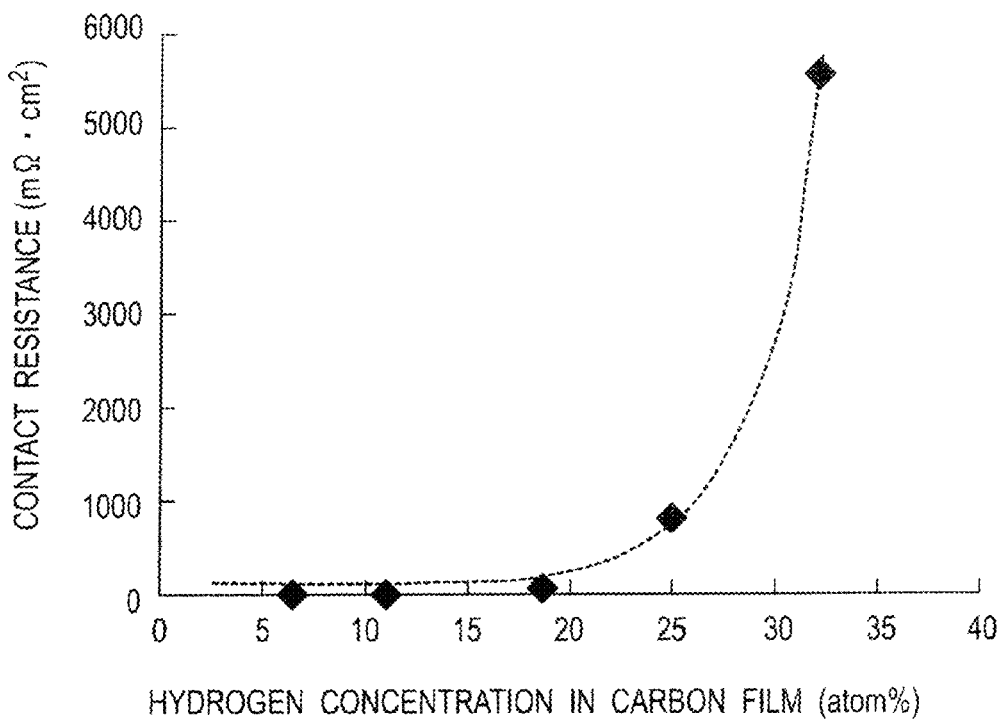
FIG. 7 is a graph showing a measurement result of contact resistances in electrical conductive members including electrical conductive carbon layers with different contents of hydrogen atoms while an R value is 1.3 or larger.
Figure 8:
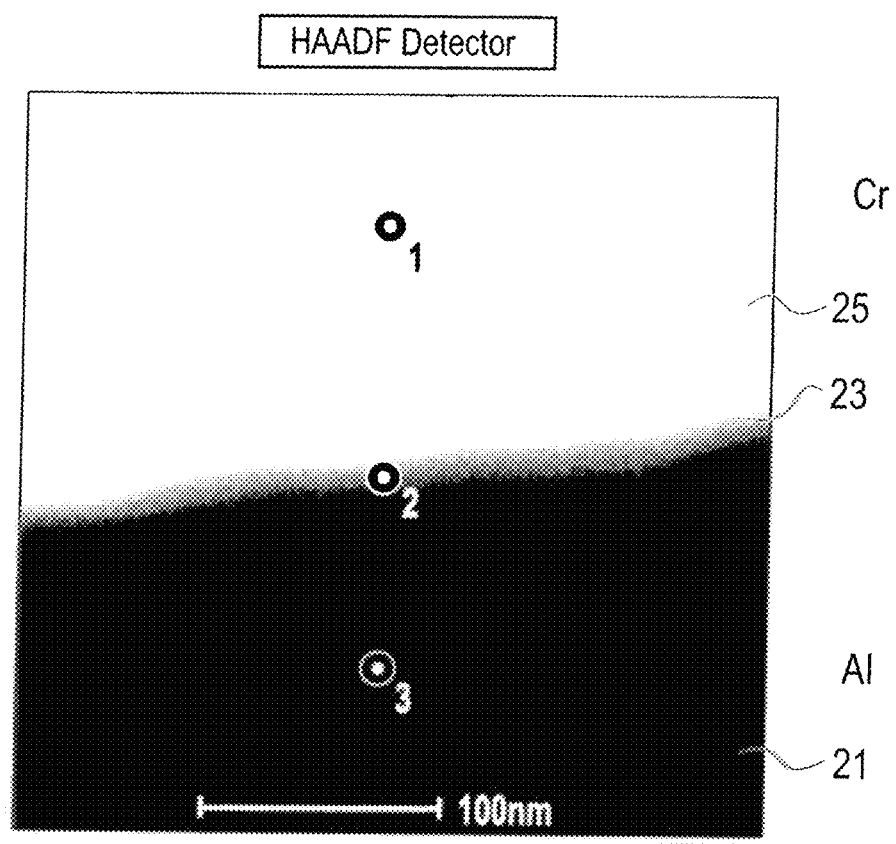
FIG. 8 is a photograph showing a result of an image analysis, using TEM, of a cross-section of an electrical conductive member prepared in Example 1.

FIG. 7 is a graph showing a measurement result of contact resistance in some electrical conductive members including the electrical conductive layers with the different contents of the hydrogen atoms while the R value is 1.3 or higher. As shown in FIG. 7, when the content of the hydrogen atoms in the electrical conductive layer is 30 atom % or lower, the contact resistance of the electrical conductive member is significantly decreased. In the test shown in FIG. 7, SUS316L was used as the metal substrate of the electrical conductive member. The intermediate layer constituted by Cr (thickness of 0.2 μm) and the electrical conductive carbon layer (thickness of 0.2 μm) were formed sequentially on the surface of the metal substrate by the sputtering method. In this case, the film formation system and the amount of hydrocarbon gas were controlled so that the content of the hydrogen atoms in the electrical conductive layer was changed.

In the present embodiment, the entire metal substrate 21 is covered with the electrical conductive layer 25 via the intermediate layer 23. In other words, in the present embodiment, an area ratio (a coverage) in the metal substrate 21 covered with the electrical conductive layer 25 is 100%. However, the coverage may be less than 100%. The coverage in the metal substrate 21 covered with the intermediate layer 23 is preferably 50% or higher, more preferably 80% or higher, even more preferably 90% or higher, most preferably 100%. According to this constitution, a reduction in electrical conductivity and resistance to corrosion in the area not covered with the electrical conductive layer 25 can be suppressed effectively. Note that the coverage represents an area ratio in the metal substrate 21 overlapping with the electrical conductive layer 25 when the electrical conductive member is viewed from the stacking direction.

The electrical conductive member according to the present embodiment may be applied to various purposes. The representative example thereof is the separator for the polymer electrolyte fuel cell (PEFC). However, the application of the electrical conductive member according to the present embodiment is not limited to the separator for the PEFC. For example, the electrical conductive member may be used for separators for various types of fuel cells such as a phosphoric acid fuel cell (PAFC), a molten carbonate fuel cell (HCFC), a solid oxide fuel cell (SOFC) and an alkaline fuel cell (AFC), in addition to the PEFC. Other than the fuel cell separators, the electrical conductive member may be used for various purposes for which both electrical conductivity and corrosion resistance are required. Examples of the purposes using the electrical conductive member according to the present embodiment include other components in the fuel cell (collector, bus bar, gas diffusion substrate, MEA), and contact points of electronic components. In another preferred embodiment, the electrical conductive member according to the present embodiment may be used under humid environment and electrical conducting environment. Under such environments, the effects of the present invention in achieving both electrical conductivity and corrosion resistance can be significantly exerted.

<Method for Manufacturing Electrical Conductive Member>

A method for manufacturing the electrical conductive member according to the present embodiment includes a step (1) of removing the oxide film of the metal substrate. The method also includes a step (2) of providing, on the metal substrate, the intermediate layer containing the constituent of the metal substrate, the constituent of the electrical conductive layer and the crystallization inhibiting component that inhibits crystallization in the intermediate layer after the step (1). The method further includes a step (3) of providing the electrical conductive layer on the intermediate layer after the step (2). Although the preferred embodiment for manufacturing the electrical conductive member is described below, the scope of the present invention is not limited to the embodiment described below. The conditions such as the materials of the respective elements in the electrical conductive member are described above, and the explanations thereof are thus not repeated.

First, the oxide film of the metal substrate is removed [step (1)]. Next, the intermediate layer is formed on the metal substrate (on the main surface of the metal substrate) from which the oxide film is removed by a sputtering method or an ion plating method [step (2)]. Then, the electrical conductive layer is further formed on the intermediate layer by the sputtering method or the ion plating method [process (3)].

[Step (1)]

First, as a constituent material of the metal substrate, a metal plate such as a stainless steel plate and an aluminum plate having a desired thickness is prepared. Next, the surface of the prepared the metal substrate is subjected to a degreasing and washing treatment by use of an appropriate solvent. Examples of the solvent include ethanol, ether, acetone, isopropyl alcohol, trichloroethylene, and a caustic alkali agent. As for the degreasing and washing treatment, ultrasonic cleaning may be performed. With regard to the conditions of the ultrasonic cleaning, the treatment time may be approximately 1 to 10 minutes, the frequency may be approximately 30 kHz to 50 kHz, and the power may be approximately 30 W to 50 W.

Then, the oxide film formed on the surface of the metal substrate is removed. Although the method of removing the oxide film is not particularly limited, examples of the method include a washing treatment by acid, a dissolution treatment by applying an electrical potential, and an ion bombardment treatment. The degreasing and washing treatment and the oxide film removal treatment are preferably performed on at least one surface of the metal plate on which the intermediate layer is provided. These treatments are more preferably performed on both sides of the metal plate.

[Step (2)]

Next, the intermediate layer is formed on the surface of the metal substrate subjected to the treatments in the step (1). Although the method of forming the intermediate layer is not particularly limited as long as crystallization is inhibited as described above, the sputtering method and the ion plating method may be used. In particular, the sputtering method is preferable.

Preferable examples of the method of forming the intermediate layer include a physical vapor deposition (PVD) method such as the sputtering method and the ion plating method. The intermediate layer may be formed by an ion beam deposition method such as a filtered cathodic vacuum arc (FCVA) method instead of the physical vapor deposition method. Examples of the sputtering method include a magnetron sputtering method, an unbalanced magnetron sputtering (UBMS) method, and a dual magnetron sputtering method. As for the ion plating method, an arc ion plating method may be used.

According to the methods described above, it is possible to provide the intermediate layer containing the three constituents (the constituent of the metal substrate, the constituent of the electrical conductive layer, and the crystallization inhibiting component that inhibits crystallization in the intermediate layer) and having the amorphous structure or the quasi-crystalline structure. In addition, according to the methods described above, it is possible to form the intermediate layer at a relatively low temperature and thereby minimize damage to the metal substrate. Further, according to the sputtering method, it is possible to control a quality of the layer formed by controlling bias voltage. In particular, by increasing the bias voltage and by using a target constituted by the constituent of the electrical conductive layer in the atmosphere using the element in Group 18 such as argon and krypton as the crystallization inhibiting component, the intermediate layer containing the three constituents can be obtained. Even at a normal bias voltage, it is possible to obtain a desirable intermediate layer by combining targets constituted by the constituent of the metal substrate, the constituent of the electrical conductive layer and the crystallization inhibiting component.

More specifically, when the intermediate layer is formed by the sputtering method, the constituent of the electrical conductive layer and the element in Group 18 are stacked on the metal substrate using the target constituted by the constituent of the electrical conductive layer in the atmosphere using the element in Group 18 while negative bias voltage is applied to the metal substrate. In this case, the constituent of the electrical conductive layer and the element in Group 18 are stacked on the metal substrate at an atomic level. Accordingly, it is possible to obtain the intermediate layer in which the constituent of the metal substrate, the constituent of the electrical conductive layer and the element in Group 18 as the crystallization inhibiting component are mixed. Examples of the element in Group 18 include helium (He), argon (Ar) and krypton (Kr), as described above.

As for the crystallization inhibiting component, the element such as boron (B), phosphorus (F), silicon (Si), carbon (C) and germanium (Ge) may be used as described above. In this case, sputtering is performed by use of the target of the element such as boron and the target constituted by the constituent of the electrical conductive layer while the negative bias voltage is applied to the metal substrate. Thus, the constituent of the electrical conductive layer and the element as the crystallization inhibiting component are stacked on the metal substrate at an atomic level and accordingly, the intermediate layer is provided. The absolute value of the negative bias voltage applied is preferably in the range from 50 V to 500 V, more preferably in the range from 100 V to 300 V.

[Step (3)]

Next, the electrical conductive layer is formed on the intermediate layer formed in the step (2). The method of forming the electrical conductive layer is not particularly limited. For example, when the electrical conductive layer is the electrical conductive carbon layer, the electrical conductive layer can be formed in such a manner that the layer containing electrical conductive carbon is stacked on the intermediate layer at an atomic level using the above-described constituent material of the electrical conductive layer (such as graphite) as a target. When the electrical conductive layer is the metal layer, the electrical conductive layer can be formed in such a manner that the layer containing the above-described constituent material of the electrical conductive layer (such as chromium) is stacked on the intermediate layer at an atomic level using the constituent material of the electrical conductive layer as a target. Accordingly, the adhesion at the interface between the electrical conductive layer and the intermediate layer directly attached to each other and the periphery thereof can be maintained for a long period of time due to the intermolecular force or the entry of a small amount of carbon atoms.

When forming the electrical conductive layer in which the electrical conductive carbon layer and the metal layer are stacked on top of each other, the electrical conductive layer can be obtained in such a manner that the target of the constituent material of the electrical conductive carbon layer and the target of the constituent material of the metal layer are switched in a reaction container. In addition, the electrical conductive layer may be formed by applying a bias voltage constantly, or may be formed by changing the bias voltage. Alternatively, the electrical conductive layer may be formed while varying the bias voltage continuously.

When the electrical conductive layer includes the electrical conductive carbon layer, preferable examples of the method of stacking electrical conductive carbon include a physical vapor deposition method such as a sputtering method and an ion plating method, and an ion beam deposition method such as a filtered cathodic vacuum arc method. Examples of the sputtering method include a magnetron sputtering method, an unbalanced magnetron sputtering (UBMS) method, a dual magnetron sputtering method, and an ECR sputtering method. As for the ion plating method, an arc ion plating method may be used. Especially, the sputtering method and the ion plating method are preferably used, and the sputtering method is more preferably used. According to those methods, the carbon layer with a small content of hydrogen can be formed. As a result, a connection ratio between carbon atoms ($sp^2$ hybridized carbon) can be increased, and excellent electrical conductivity can be achieved. Moreover, the film formation at a relatively low temperature is possible and therefore, damage to the intermediate layer can be minimized. Further, according to the sputtering method, it is possible to control the quality of the layer formed by controlling the bias voltage.

When the electrical conductive layer is formed by the sputtering method, the negative bias voltage is preferably applied to the intermediate layer during sputtering. As a result, the electrical conductive layer having a structure in which graphite clusters are densely assembled can be formed due to an ion irradiation effect. Since the electrical conductive layer thus obtained can exert excellent electrical conductivity, the electrical conductive member (the separator) having low contact resistance with respect to other members (such as MEA) can be provided. Similarly, when the electrical conductive layer including the metal layer is formed by the sputtering method, the negative bias voltage is preferably applied to the intermediate layer during sputtering. The level (absolute value) of the negative bias voltage applied is not particularly limited as long as the electrical conductive layer is formed. For example, the level of the applied voltage is preferably in the range from 50 V to 500 V, more preferably in the range from 100 V to 300 V. Other conditions when forming the electrical conductive layer are not particularly limited, and conventionally known findings are applied as appropriate.

According to the above-described methods, it is possible to manufacture the electrical conductive member in which the metal substrate 21, the intermediate layer 23 and the electrical conductive layer 25 are sequentially formed. In the case of manufacturing the electrical conductive member in which the respective layers are formed on both sides of the metal substrate 21, the same methods described above may be applied also to the other side of the metal substrate 21.

<Polymer Electrolyte Fuel Cell>

The polymer electrolyte fuel cell according to the present embodiment includes the membrane electrode assembly that includes the polymer electrolyte membrane, a pair of the anode catalyst layer and the cathode catalyst layer interposing the polymer electrolyte membrane therebetween, and a pair of the anode gas diffusion layer and cathode gas diffusion layer interposing the anode catalyst layer, the cathode catalyst layer and the polymer electrolyte membrane therebetween. The polymer electrolyte fuel cell further includes the anode separator and the cathode separator that interpose the membrane electrode assembly therebetween. At least one of the anode separator and the cathode separator is constituted by the electrical conductive member described above including the metal substrate, the intermediate layer formed on the metal substrate, and the electrical conductive layer formed on the intermediate layer. In the separator, the electrical conductive layer is preferably provided on the membrane electrode assembly side.

The electrical conductive member according to the present embodiment may be applied to various purposes. The representative example thereof is the separator of the PEFC shown in FIG. 1. The elements of the PEFC using the separator constituted by the electrical conductive member according to the present embodiment is explained below with reference to FIG. 1. It is to be noted that the present invention is characterized by the electrical conductive member constituting the separator. Therefore, specific configurations such as a shape of the separator, and specific configurations of other members other than the separator in the PEFC are arbitrarily modified with reference to conventionally known findings.

[Polymer Electrolyte Layer]

The polymer electrolyte membrane 11 as a polymer electrolyte layer has a function to selectively transmit protons generated in the anode catalyst layer 13a to the cathode catalyst layer 13c in the film thickness direction during the operation of the PEFC 1. In addition, the polymer electrolyte membrane 11 has a function as a partition not to mix fuel gas supplied to the anode side with oxidant gas supplied to the cathode side.

The polymer electrolyte membrane 11 is broadly divided into a fluorinated polymer electrolyte membrane and a hydrocarbon polymer electrolyte membrane depending on the type of ion exchange resin as a constituent material. Examples of the ion exchange resin constituting the fluorinated polymer electrolyte membrane include: a perfluorocarbon sulfonic acid polymer such as Nafion (registered trademark, manufactured by DuPont Corporation), Aciplex (registered trademark, manufactured by Asahi Kasei Corporation), and Flemion (registered trademark, manufactured by Asahi Glass Co. Ltd.); a perfluorocarbon phosphonic acid polymer; a trifluorostyrene sulfonic acid polymer; an ethylenetetrafluoroethylene-g-styrene sulfonic acid polymer; an ethylene-tetrafluoroethylene copolymer; and a polyvinylidene fluoride-perfluorocarbon sulfonic acid polymer. In view of the improvement in power generation performance such as heat resistance and chemical stability, the above-mentioned examples of the fluorinated polymer electrolyte membrane are preferably used. In particular, the fluorinated polymer electrolyte membrane constituted by the perfluorocarbon sulfonic acid polymer is preferably used.

Specific examples of the hydrocarbon polymer electrolyte membrane include sulfonated polyether sulfone (S-PES), sulfonated polyaryl ether ketone, alkyl sulfonated polybenzimidazole, alkyl phosphonated polybenzimidazole, sulfonated polystyrene, sulfonated polyether ether ketone (S-PEEK), and sulfonated polyphenylene (S-PPP). In view of manufacturing factors such as low-cost raw materials, easy manufacturing processes, and high material selectivity, the above-mentioned examples of the hydrocarbon polymer electrolyte membrane are preferable. The above-mentioned examples of the ion exchange resin may be used singly, or may be used with a combination of two or more types thereof. The ion exchange resin is not limited to the above-mentioned materials, and other materials may be used.

The thickness of the polymer electrolyte layer is not particularly limited as long as the thickness is determined as appropriate in view of characteristics of the fuel cell to be obtained. However, the thickness of the polymer electrolyte layer is generally approximately in the range from 5 μm to 300 μm. When the thickness of the polymer electrolyte layer is within this range, the balance among the intensity during the layer formation, durability in use, and the output property in use can be properly controlled.

[Catalyst Layer]

The catalyst layers (the anode catalyst layer 13a and the cathode catalyst layer 13c) are the ones in which a cell reaction actually proceeds. In particular, an oxidation reaction of hydrogen proceeds in the anode catalyst layer 13a, and a reduction reaction of oxygen proceeds in the cathode catalyst layer 13c. The catalyst layers include a catalyst component, an electrical conductive catalyst support supporting the catalyst component, and an electrolyte. Hereinafter, a composite body in which the catalyst component is supported on the catalyst support is also referred to as "an electrode catalyst".

The catalyst component used for the anode catalyst layer 13a is not particularly limited as long as the catalyst component has a catalytic function for an oxidation reaction of hydrogen, and known catalyst components may be used. The catalyst component used for the cathode catalyst layer 13c is also not particularly limited as long as the catalyst component has a catalytic function for a reduction reaction of oxygen, and known catalyst components may be used. In particular, the catalyst component may be selected from platinum (Pt), ruthenium (Ru), iridium (Ir), rhodium (Rh), palladium (Pd), osmium (Os), tungsten (W), lead (Pb), iron (Fe), chromium (Cr), cobalt (Co), nickel (Ni), manganese (Mn), vanadium (V), molybdenum (Mo), gallium (Ga) and aluminum (A), and alloys thereof.

Among the above-mentioned elements, the catalyst component at least containing platinum is preferably used in order to enhance catalytic activity, poisoning resistance to carbon monoxide, heat resistance, and the like. With regard to the composition of the alloy, the content of platinum is preferably in the range from 30 to 90 atom %, and the content of metal alloyed with platinum is preferably in the range from 10 to 70 atom %, although the composition depends on the type of metal formed into the alloy. Note that an alloy is generally constituted by a metal element to which one or more different metal elements or nonmetal elements are added, and is a general term for elements having a metallic property. Examples of the constitution of the alloy include an eutectic alloy, that is, a mixture in which component elements turn into individual crystals, a solid solution in which the component elements are completely blended together, and a compound in which the component elements compose an intermetallic compound or a compound of metal and nonmetal, and any of those may be applied to the present invention. In the present embodiment, the catalyst component used in the anode catalyst layer and the catalyst component used in the cathode catalyst layer may be appropriately selected from the above-mentioned components. In the present Description, unless otherwise specified, the similar definition is applied to both the anode catalyst layer and the cathode catalyst layer with regard to the catalyst components, which are collectively referred to as a "catalyst component". However, the catalyst components for the anode catalyst layer and the cathode catalyst layer are not necessarily the same. The catalyst components are appropriately selected for each catalyst layer so as to exert the desired effects described above.

The shape and size of the catalyst component is not particularly limited, and a similar shape and size to known catalyst components may be employed. However, the catalyst component preferably has a granular shape. In this case, an average particle diameter of catalyst particles is preferably in the range from 1 nm to 30 nm. When the average particle diameter of the catalyst particles is within this range, the balance between catalyst efficiency and supporting easiness in relation to the electrode area in which the electrochemical reaction proceeds can be properly controlled. Note that "an average particle diameter of catalyst particles" may be measured as a crystallite diameter obtained from a full width at half maximum of a diffraction peak of the catalyst component in an X-ray diffraction, or may be measured as an average value of the particle diameters of the catalyst component observed by a transmission electron microscope.

The catalyst support functions to support the catalyst component described above, and functions as an electrical conductive path involved in a communication of electrons among the catalyst component and other members. The catalyst support preferably has a specific surface area sufficient to support the catalyst component in a desired dispersed state, and has sufficient electron conductivity. Preferably, the catalyst support contains carbon as a main component. In particular, carbon particles constituted by carbon black, activated carbon, coke, natural graphite, artificial graphite, and the like may be used. In the present embodiment, "containing carbon as a main component" denotes that carbon atoms are contained as a main component, and includes the concept that the catalyst support is composed only of the carbon atoms, and the concept that the catalyst support is substantially constituted by the carbon atoms. Depending on the situations, elements other than the carbon atoms may be contained in order to improve the characteristics of the fuel cell. Note that "being substantially constituted by the carbon atoms" denotes that an inclusion of impurities with approximately 2 to 3% by mass or less may be permitted.

The catalyst support preferably has a BET specific surface area sufficient to support the catalyst component in a highly dispersed state. The BET specific surface area is preferably in the range from 20 to 1600 $m^2/g$, more preferably in the range from 80 to 1200 $m^2/g$. When the specific surface area of the catalyst support is within the above-mentioned range, the balance between dispersibility of the catalyst component and efficiency of the catalyst component on the catalyst support can be properly controlled. The size of the catalyst support is not particularly limited. However, an average particle diameter is preferably in the rang from 5 nm to 200 nm, more preferably in the range from 10 nm to 100 nm, in view of supporting easiness, catalyst efficiency, thickness control of the catalyst layer within an appropriate range, and the like.

In the electrode catalyst in which the catalyst component is supported on the catalyst support, the supported amount of the catalyst component is preferably in the range from 10 to 80% by mass, more preferably in the range from 30 to 70% by mass, with respect to the total amount of the electrode catalyst. When the supported amount of the catalyst component is within the above-mentioned range, the balance between dispersibility of the catalyst component and catalytic performance on the catalyst support can be properly controlled. Note that the supported amount of the catalyst component in the electrode catalyst may be measured by an inductively coupled plasma (ICP) emission spectrometry.

The respective catalyst layers include an ion conductive polymer electrolyte in addition to the electrode catalyst. The polymer electrolyte is not particularly limited, and conventionally known findings may be applied as necessary. For example, the above-mentioned ion exchange resin constituting the polymer electrolyte membrane may be added to the catalyst layers as a polymer electrolyte.

[Gas Diffusion Layer]

The gas diffusion layers (the anode gas diffusion layer 15a and the cathode gas diffusion layer 15c) have a function to promote diffusion of gas (fuel gas or oxidant gas) in the catalyst layers 13a and 13c supplied via the gas flow paths GPa and GPc of the separators, and a function as an electrical conductive path.

The material constituting substrates of the gas diffusion layers 15a and 15c is not particularly limited, and conventionally known findings may be applied as appropriate. For example, the material may be a sheet-like material having electrical conductivity and porosity such as carbon-made fabric, finished paper, felt, and nonwoven fabric. Although the thickness of the substrates may be determined as appropriate in view of the characteristics of the gas diffusion layers to be obtained, the thickness may be approximately in the range from 30 μm to 500 μm. When the thickness of the substrates is within the above-mentioned range, the balance between a mechanical strength and dispersibility of gas and water can be properly controlled.

The gas diffusion layers preferably contain a water repellent agent in order to prevent a flooding phenomenon and the like by increasing water repellency. Although the water repellent agent is not particularly limited, examples thereof include: a fluorinated polymer material such as polytetrafluoroethylene (PTFE), polyvinylidene fluoride (PVdF), polyhexafluoropropylene, and a tetrafluoroethylene-hexafluoropropylene copolymer (FEP); polypropylene; and polyethylene.

In addition, in order to further improve water repellency, the respective gas diffusion layers may be provided with a carbon particle layer (a microporous layer: MPL) containing the water repellent agent and constituted by an aggregation of carbon particles on the catalyst layer side. The carbon particles contained in the carbon particle layer are not particularly limited, and conventionally known materials such as carbon black, graphite and expanded graphite may be used as appropriate. In particular, carbon black such as oil furnace black, channel black, lamp black, thermal black and acetylene black is preferably used because of excellent electronic conductivity and a large specific surface area. An average particle diameter of the carbon particles is preferably approximately in the range from 10 nm to 100 nm. Accordingly, high drainage property due to a capillary force can be obtained, and adhesion to the catalyst layers can also be improved.

A water repellent agent used in the carbon particle layer may be similar to the above-mentioned water repellent agent. In particular, the fluorinated polymer material is preferably used because of high water repellency and corrosion resistance during the electrode reaction. The mixture ratio between the carbon particles and the water repellent agent in the carbon particle layer is preferably approximately 90:10 to 40:60 (carbon particles:water repellent agent) in the mass ratio, in view of the balance between water repellency and electronic conductivity. The thickness of the carbon particle layer is not particularly limited, and may be determined as appropriate in consideration of the water repellency in the gas diffusion layers to be obtained.

The method for manufacturing the fuel cell is not particularly limited, and conventionally known findings in the field of the fuel cell may be applied as appropriate.

The type of the fuel gas used during the operation of the fuel cell is not particularly limited. Examples of the fuel gas include hydrogen, methanol, ethanol, 1-propanol, 2-propanol, 1-butanol, secondary butanol, tertiary butanol, dimethyl ether, diethyl ether, ethylene glycol and diethylene glycol. In particular, hydrogen and methanol are preferably used in terms of a high output property.

In order to ensure a desired voltage for the fuel cell, a fuel cell stack having a structure in which a plurality of membrane electrode assemblies are stacked and connected in series via separators may be provided. The shape of the fuel cell is not particularly limited as long as a desired battery property including a voltage is obtained.

The PEFC 1 and the fuel cell stack described above use the separators 20 each of which is constituted by the electrical conductive member having excellent electrical conductivity and resistance to corrosion. Therefore, the PEFC 1 and the fuel cell stack can exert an excellent output property and durability, and maintain a high power generation performance for a long period of time. In the PEFC 1 shown in FIG. 1, the separators 20 have a concave-convex configuration formed in such a manner that the plate-like electrical conductive member is subjected to press processing. However, the separators are not limited to this configuration. For example, the separator may be formed in such a manner that a flat metal plate (the metal substrate) is subjected to cutting processing so as to preliminarily have a concave-convex configuration serving as a gas flow path and a coolant path and thereafter, the intermediate layer and the electrical conductive layer are formed on the surface of the metal plate by the methods described above.

The PEFC 1 according to the present embodiment and the fuel cell stack using the PEFC 1 may be mounted on a vehicle as a driving power source. The PEFC 1 and the fuel cell stack have an excellent output property and durability. Therefore, a vehicle mounted with the fuel cell capable of maintaining high reliability for a long period of time can be provided.

EXAMPLES

The present invention is further explained below with reference to some examples. However, the scope of the present invention is not limited to these examples.

Example 1

An aluminum alloy plate (A3003P, thickness: 200 μm) was prepared as a metal substrate constituting an electrical conductive member. The aluminum alloy plate was washed by ultrasonic waves in an ethanol aqueous solution for three minutes as a pretreatment. Then, the washed aluminum alloy plate was placed in a vacuum chamber, and subjected to an ion bombard treatment by argon gas, so as to remove an oxide film on the surface thereof. Note that the pretreatment was performed on both surfaces of the aluminum alloy plate.

Next, an intermediate layer was formed by use of an unbalanced magnetron sputtering (UBMS) method using chromium as a target while applying negative bias voltage of 250 V to the aluminum alloy plate under the presence of argon. The intermediate layer was formed on each surface of the aluminum alloy plate. The intermediate layer thus obtained had a thickness of 50 nm containing aluminum, chromium and argon.

In addition, a second electrical conductive layer (a chromium layer) having a thickness of 0.3 μm was formed on the intermediate layer on each surface of the aluminum alloy plate by use of the UBMS method using chromium as a target while applying negative bias voltage of 140 V to the aluminum alloy plate. Thereafter, a first electrical conductive layer having a thickness of 0.1 μm was formed on the second electrical conductive layer on each surface of the aluminum alloy plate by use of the UBMS method using solid graphite as a target while applying negative bias voltage of 140 V to the aluminum alloy plate. Thus, the electrical conductive member of this example was prepared.

Reference Example 2

An aluminum alloy plate (A3003P, thickness: 200 μm) was prepared as a metal substrate constituting an electrical conductive member. The aluminum alloy plate was washed by ultrasonic waves in an ethanol aqueous solution for three minutes as a pretreatment. Then, the washed aluminum alloy plate was placed in a vacuum chamber, and subjected to an ion bombard treatment by argon gas, so as to remove an oxide film on the surface thereof. Note that the pretreatment was performed on both surfaces of the aluminum alloy plate.

Next, an intermediate layer was formed by use of a UBMS method using chromium as a target while applying negative bias voltage of 50 V to the aluminum alloy plate under the presence of argon. The intermediate layer was formed on each surface of the aluminum alloy plate. The intermediate layer thus obtained had a thickness of 25 nm containing aluminum, chromium and argon.

In addition, a second electrical conductive layer (a chromium layer) having a thickness of 0.3 μm was formed on the intermediate layer on each surface of the aluminum alloy plate by use of the UBMS method using chromium as a target while applying negative bias voltage of 140 V to the aluminum alloy plate. Thereafter, a first electrical conductive layer having a thickness of 0.1 μm was formed on the second electrical conductive layer on each surface of the aluminum alloy plate by use of the UBMS method using solid graphite as a target while applying negative bias voltage of 140 V to the aluminum alloy plate. Thus, the electrical conductive member of this example was prepared.

Example 3

An aluminum alloy plate (A3003P, thickness: 200 μm) was prepared as a metal substrate constituting an electrical conductive member. The aluminum alloy plate was washed by ultrasonic waves in an ethanol aqueous solution for three minutes as a pretreatment. Then, the washed aluminum alloy plate was placed in a vacuum chamber, and subjected to an ion bombard treatment by argon gas, so as to remove an oxide film on the surface thereof. Note that the pretreatment was performed on both surfaces of the aluminum alloy plate.

Next, an inter mediate layer was formed by use of a UBMS method using chromium as a target while applying negative bias voltage of 140 V to the aluminum alloy plate under the presence of argon. The intermediate layer was formed on each surface of the aluminum alloy plate. The intermediate layer thus obtained had a thickness of 30 nm containing aluminum, chromium and argon.

In addition, a second electrical conductive layer (a chromium layer) having a thickness of 0.3 μm was formed on the intermediate layer on each surface of the aluminum alloy plate by use of the UBMS method using chromium as a target while applying negative bias voltage of 140 V to the aluminum alloy plate. Thereafter, a first electrical conductive layer having a thickness of 0.1 μm was formed on the second electrical conductive layer on each surface of the aluminum alloy plate by use of the UBMS method using solid graphite as a target while applying negative bias voltage of 140 V to the aluminum alloy plate. Thus, the electrical conductive member of this example was prepared.

[Observation of Constituent of Electrical Conductive Member]

Figure 9:
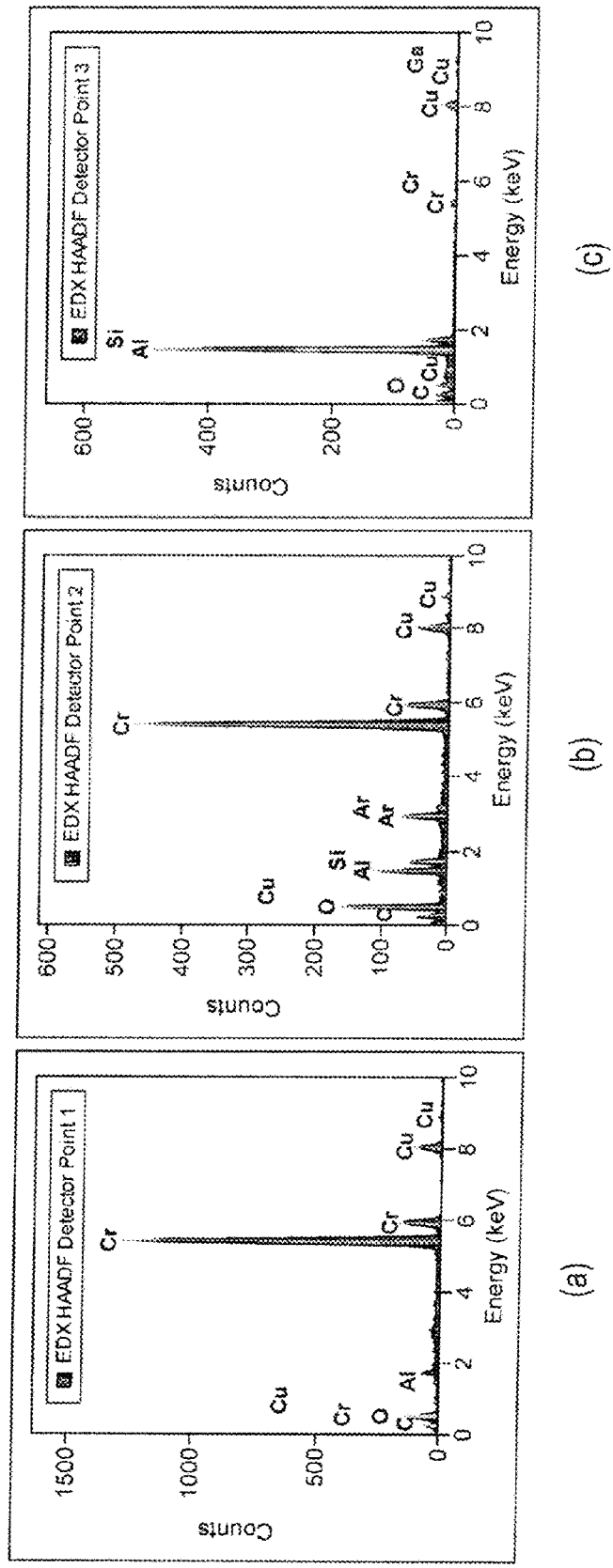
FIG. 9 shows graphs each showing a result of a composition analysis, using EDX, of the cross-section of the electrical conductive member prepared in Example 1.
Figure 10:
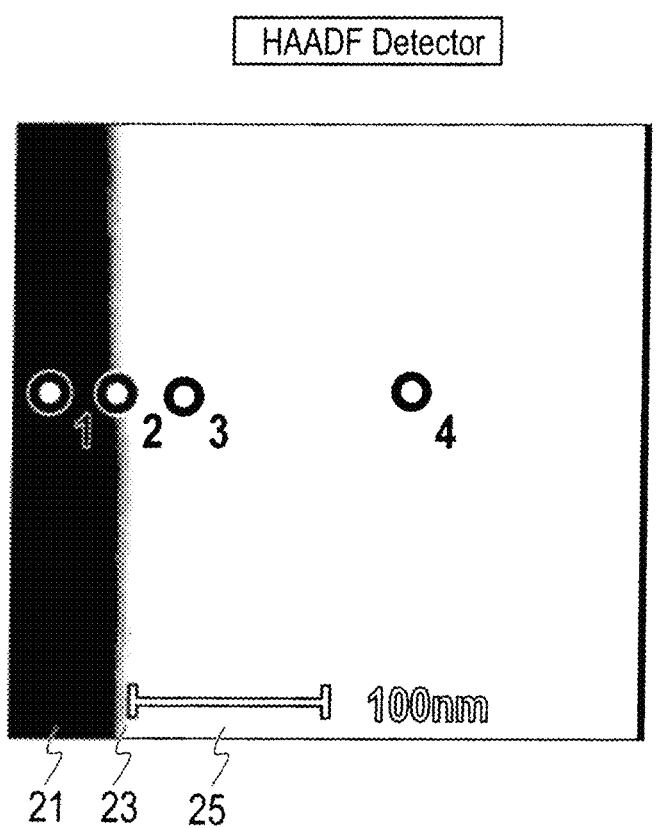
FIG. 10 is a photograph showing a result of an image analysis, using TEM, of a cross-section of an electrical conductive member prepared in Reference Example 2.
Figure 11:
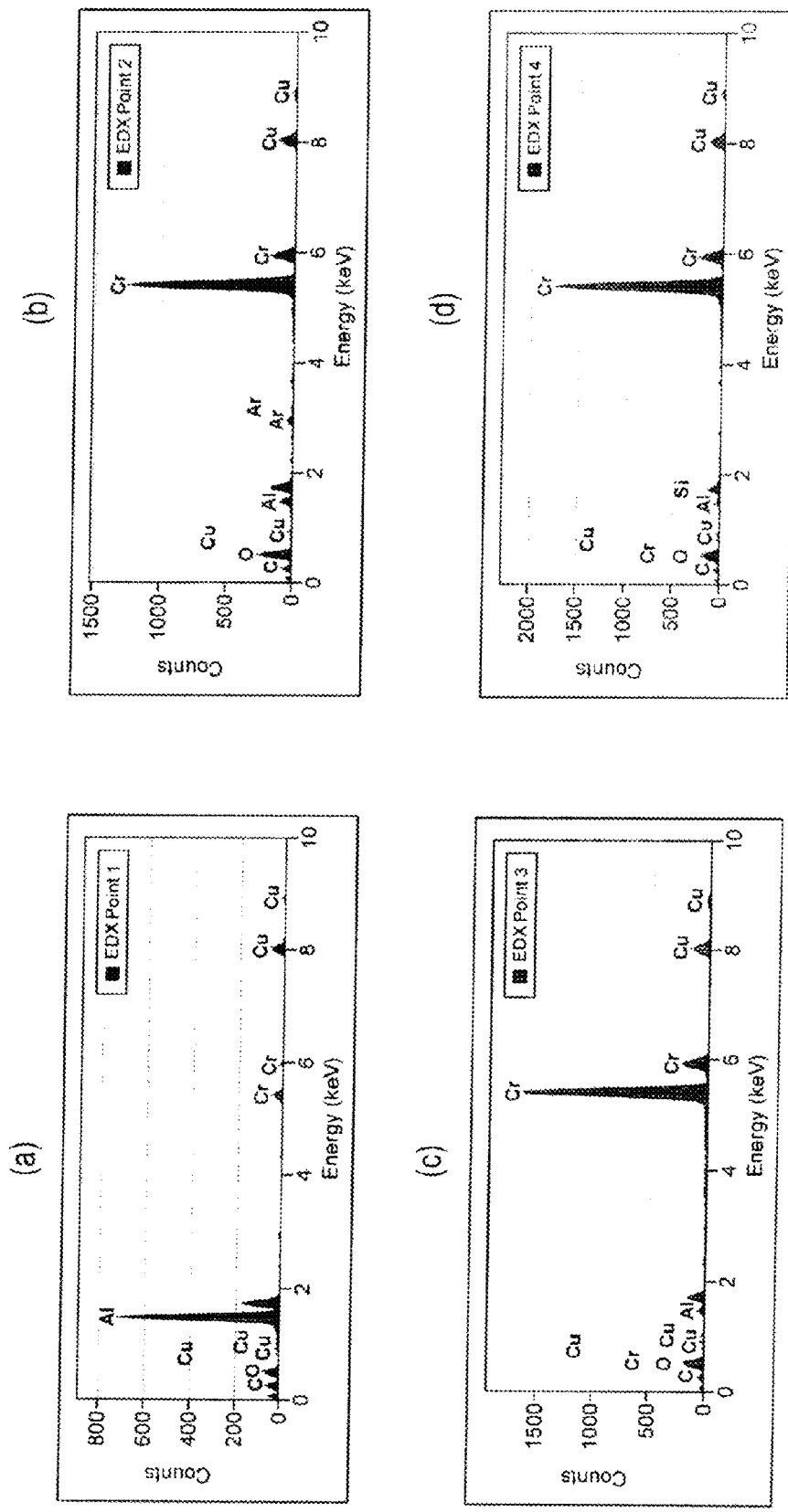
FIG. 11 shows graphs each showing a result of a composition analysis, using EDX, of the cross-section of the electrical conductive member prepared in Reference Example 2.
Figure 12:
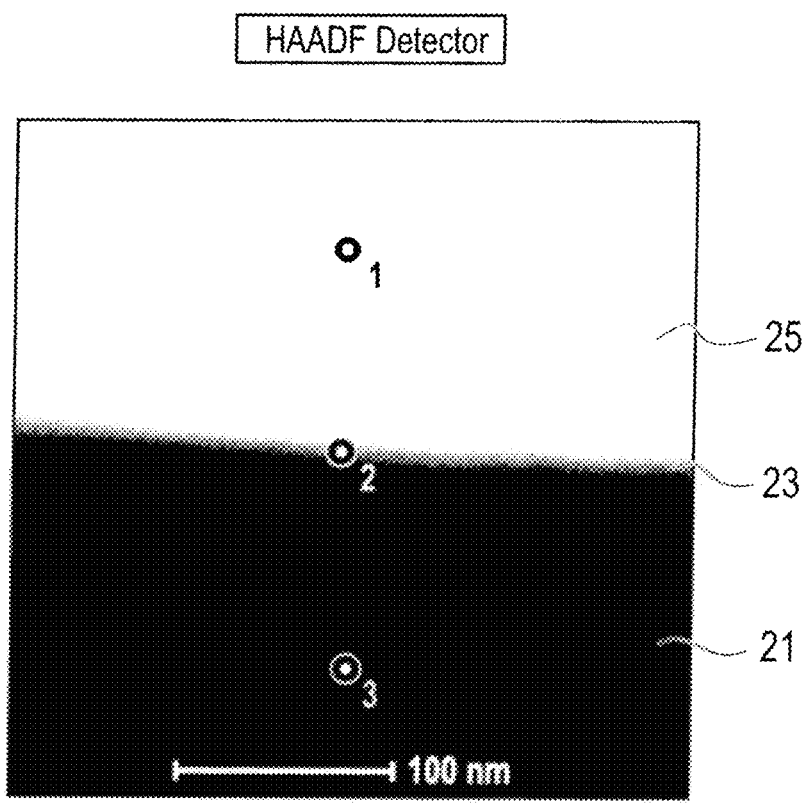
FIG. 12 is a photograph showing a result of an image analysis, using TEM, of a cross-section of an electrical conductive member prepared in Example 3.
Figure 13:
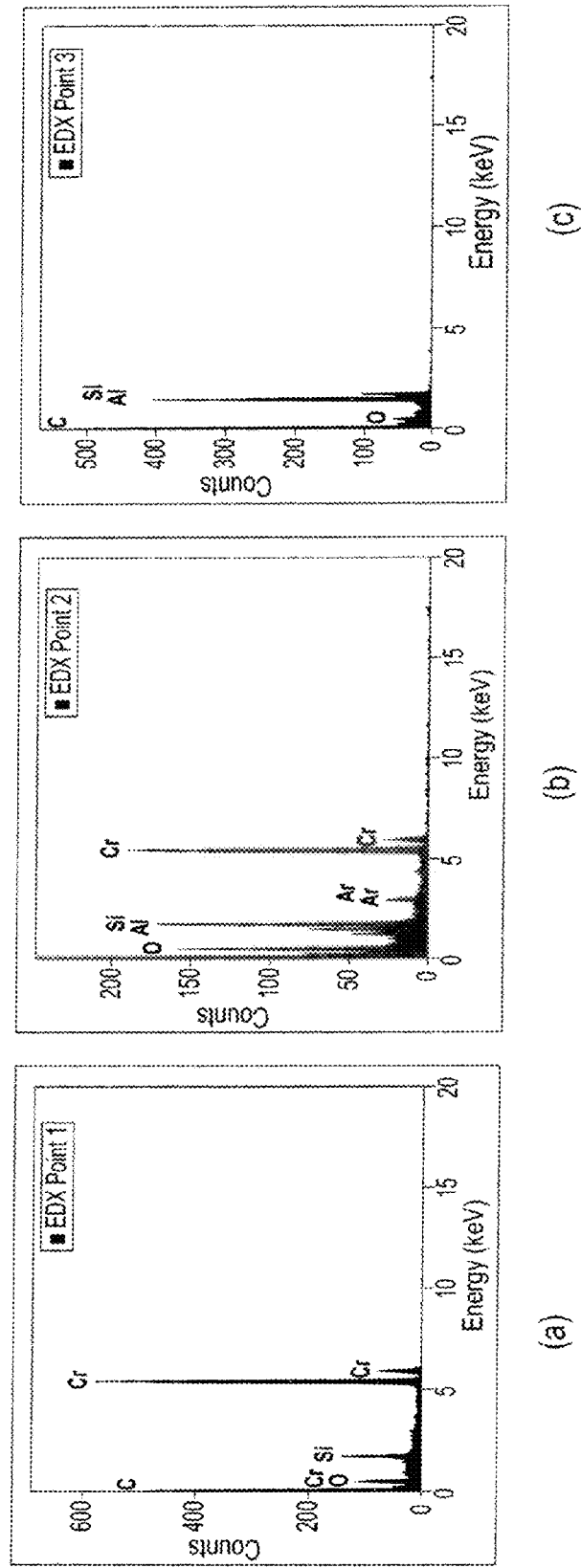
FIG. 13 shows graphs each showing a result of a composition analysis, using EDX, of the cross-section of the electrical conductive member prepared in Example 3.

With regard to the electrical conductive member prepared in the respective examples, the constituents of the metal substrate, the intermediate layer and the electrical conductive layer were observed. FIG. 8 to FIG. 12 show the results of image analysis by TEM and the results of composition analysis by EDX with respect to the cross-section of each electrical conductive member. FIGS. 9(a) to 9(c) show the results of composition analysis at each point of "$\circ_1$" to "$\circ_3$" in FIG. 8. FIGS. 11(a) to 11(d) show the results of composition analysis at each point of "$\circ_1$" to "$\circ_4$" in FIG. 10. FIGS. 13(a) to 13(c) show the results of composition analysis at each point of "$\circ_1$" to "$\circ_3$" in FIG. 12.

As is evident from FIG. 8 to FIG. 13, the intermediate layer contains aluminum as the constituent of the metal substrate, chromium as the constituent of the electrical conductive layer, and argon as the crystallization inhibiting component that inhibits crystallization in the intermediate layer. The content of argon in the intermediate layer of Example 1 was 5 atom %. In the result of composition analysis by EDX in Reference Example 2, it is can be seen that the portion with 2 atom % of argon that is assumed to be the intermediate layer was formed. In the result of composition analysis by EDX in Example 3, it is can be seen that the portion with 3 atom % of argon that is assumed to be the intermediate layer is formed.

[Observation of Structure of Intermediate Layer]

Figure 14:
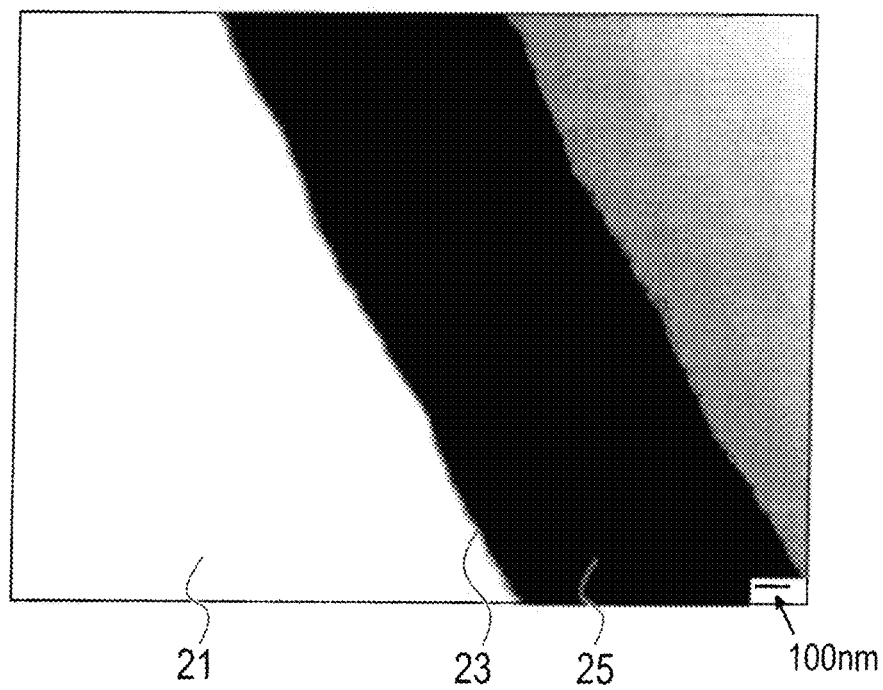
FIG. 14 is a photograph showing a result of an image analysis, using TEM, of a cross-section of an intermediate layer prepared in Example 1.

With regard to the electrical conductive member prepared in Example 1, the structure of the intermediate layer was observed. FIG. 14 shows the result of image analysis by TEM with respect to the cross-section of the intermediate layer. As is evident from FIG. 8 and FIG. 9, the intermediate layer has a mixed layer containing aluminum as the constituent of the metal substrate, chromium as the constituent of the electrical conductive layer, and argon as the crystallization inhibiting component that inhibits crystallization in the intermediate layer. Further, as is evident from FIG. 14, the intermediate layer has the amorphous structure or the quasi-crystalline structure. The presence or absence of the amorphous structure or the quasi-crystalline structure in the intermediate layer may be determined as follows. When the chromium layer is formed directly on the aluminum alloy plate without argon by the above-described method, a columnar structure (columnar crystals) with high crystallinity is formed. When the columnar crystals are formed, the interfaces between the columnar crystals can be observed by TEM. However, no interface between the columnar crystals was observed in the intermediate layer in FIG. 14. Accordingly, it can be determined that the intermediate layer has the amorphous structure or the quasi-crystalline structure.

[Measurement of R Value]

With regard to the electrical conductive member prepared in the respective examples, the R value of the electrical conductive carbon layer was measured. In particular, first, Raman spectrum of the electrical conductive carbon layer was measured by use of a Micro-Raman spectroscope. Then, the peak area ratio ($I_D/I_G$) of the peak intensity ($I_D$) of D-band located at 1300 to 1400 cm$^{-1}$ to the peak intensity ($I_G$) of G-band located at 1500 to 1600 cm$^{-1}$ was calculated to determine the R value. The result thus obtained is shown in Table 1 below. As shown in Table 1, the R values of the electrical conductive layers in the electrical conductive members prepared in the respective examples were all 1.3 or higher.

[Measurement of Hydrogen Atom Content in Electrical Conductive Carbon Layer]

With regard to the electrical conductive member prepared in the respective examples, the content of hydrogen atoms in the electrical conductive carbon layer was measured by an elastic recoil detection analysis (ERDA). The result thus obtained is shown in Table 1 below.

[Measurement of Vickers Hardness (Hv) of Metal Substrate, Intermediate Layer and Electrical Conductive Carbon Layer]

With regard to the electrical conductive member prepared in the respective examples, the Vickers hardness (Hv) of each of the metal substrate, the intermediate layer and the electrical conductive carbon layer was measured by a nanoindentation method. The result thus obtained is shown in Table 1 below. With regard to the electrical conductive member prepared in each example, as is obvious from Table 1, the Vickers hardness of the intermediate layer shows the value between the Vickers hardness of the metal substrate and the Vickers hardness of the electrical conductive carbon layer. In addition, as shown in Table 1, the values of the Vickers hardness of the electrical conductive carbon layers in the electrical conductive members prepared in the respective examples were all 1500 Hv or lower.

[Measurement of Contact Resistance]

Figure 15:
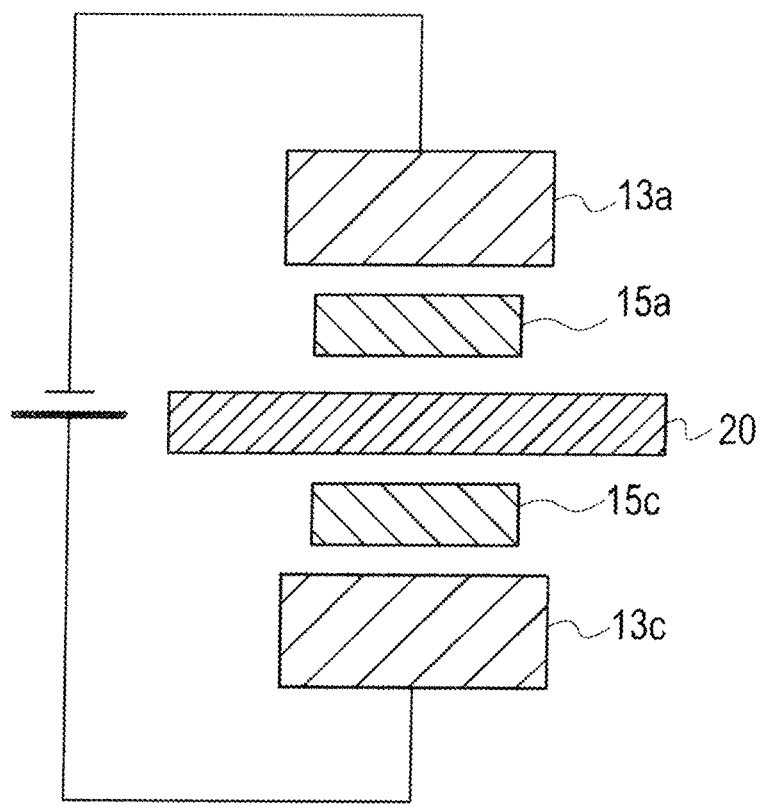
FIG. 15 is a schematic view showing a measurement device used for measuring contact resistance.

With regard to the electrical conductive member prepared in the respective examples, the contact resistance in the thickness direction of the electrical conductive member was measured. In particular, as shown in FIG. 15, the prepared electrical conductive member (the separator 20) was interposed between a pair of gas diffusion substrates (the gas diffusion layers 15a and 15c), and the stacked body thus obtained was further interposed between a pair of electrodes (the catalyst layers 13a and 13c). The both ends of the stacked body were connected to a power source and kept while applying a load of 1 MPa to the entire stacked body including the electrodes, so as to compose a measurement device. Then, a constant current of 1 A was applied to the measurement device, and the contact resistance of the stacked body was calculated according to the amount of power distribution and the voltage value when applying the load of 1 MPa.

In addition, after the contact resistance was measured, the test for immersion in acidic water was performed, and the contact resistance was measured in the same manner. In particular, the immersion test was performed in such a manner that the electrical conductive member (the separator 20) prepared in each example was cut into 30 mm×30 mm pieces, and the cut electrical conductive member was immersed in acidic water (pH 6 or lower) at 80° C. for 100 hours. The result thus obtained is shown in Table 1 below. Note that "a contact resistance relative value" in Table 1 represents a relative value showing the contact resistance after the immersion test when the contact resistance before the immersion is set to 1.

excellent electrical conductivity and resistance to corrosion is used, the PEFC can obtain an excellent output property and durability, and maintain the high output performance for a long period of time.

Examples of conventionally known constituent materials used for a fuel cell separator for which electrical conductivity is required include metal, carbon and electrical conductive resin. In particular, a separator constituted by carbon and a separator constituted by electrical conductive resin are required to be relatively thick in order to ensure intensity to some extent after the formation of gas flow paths. On the other hand, a separator constituted by metal can be relatively reduced in thickness since the intensity thereof is relatively high. Accordingly, the electrical conductive member according to the present invention and the separator for a fuel cell using the electrical conductive member are suitable for the PEFC used in a vehicle for which downsizing of fuel cell stacks is required.

The entire content of Japanese Patent Application No. P2010-161610 (filed on Jul. 16, 2010) is herein incorporated by reference.

Although the present invention has been described above according to the examples, the present invention is not limited to the descriptions thereof, and it will be apparent to a person skilled in the art that various modifications and improvements can be made within the scope of the present invention.

INDUSTRIAL APPLICABILITY

According to the present invention, the intermediate layer containing the constituent of the metal substrate, the constituent of the electrical conductive layer and the crystallization inhibiting component that inhibits crystallization in

TABLE 1

| | Metal Substrate | | Intermediate Layer | | | | | Electrical Conductive Layer | | | Contact Resistance |
|---|---|---|---|---|---|---|---|---|---|---|---|
| | | | | | Crystallization Inhibiting | | | | (Electrical Conductive Carbon Layer) | | |
| | Constituent | Vickers Hardness (Hv) | Constituent | Structure | Component Content (atom %) | Thickness (nm) | Vickers Hardness (Hv) | ID/IG (—) | Hydrogen Content (atom %) | Vickers Hardness (Hv) | Relative Value (—) |
| Example 1 | Al | 20 | Al, Cr, Ar | Mixed | 5 | 50 | 356 | 1.7 | 6.4 | 581 | 1.4 |
| Reference Example 2 | Al | 20 | Al, Cr, Ar | — | 2 | 25 | 356 | 1.7 | 6.4 | 581 | 2.3 |
| Example 3 | Al | 20 | Al, Cr, Ar | — | 3 | 30 | 356 | 1.7 | 6.4 | 581 | 1.5 |

As shown in Table 1, the contact resistance values of the electrical conductive members prepared in the respective examples were reduced to a quite low level even after the immersion test. It is apparent that the defects such as pinholes were significantly reduced, the resistance to corrosion was increased, and the adhesion after the durability test was also improved when the crystallization inhibiting component was contained in the intermediate layer. That is, the electrical conductive member according to the present invention clearly has excellent electrical conductivity and high resistance to corrosion. Further, when the separator constituted by the electrical conductive member having the intermediate layer is provided between the metal substrate and the electrical conductive layer. Accordingly, the electrical conductive member having excellent electrical conductivity and corrosion to resistance, the method for manufacturing the electrical conductive member, and the separator for a fuel cell and the polymer electrolyte fuel cell using the same can be provided.

REFERENCE SIGNS LIST

1 Polymer electrolyte fuel cell (PEFC)
10 Membrane electrode assembly (MEA)

11 Polymer electrolyte membrane
13 Catalyst layer
15 Gas diffusion layer
20 Separator
21 Metal substrate
23 Intermediate layer
25 Electrical conductive layer

The invention claimed is:

1. An electrical conductive member, comprising:
a metal substrate;
an intermediate layer formed on the metal substrate and having a thickness of 30 nm to 200 nm; and
an electrical conductive layer formed on the intermediate layer,
wherein the intermediate layer comprises a constituent of the metal substrate; a constituent of the electrical conductive layer; and at least one element selected from the group consisting of helium, argon, krypton, boron, phosphorus, silicon, carbon and germanium, and
wherein a content ratio of the at least one element in the intermediate layer is in a range from 3 to 5 atom %.

2. The electrical conductive member according to claim 1, wherein the intermediate layer has at least one of an amorphous structure and a quasi-crystalline structure having a crystallite diameter smaller than a crystallite diameter of each of the metal substrate and the electrical conductive layer.

3. The electrical conductive member according to claim 1, wherein the metal substrate is constituted by aluminum or an aluminum alloy.

4. A separator for a fuel cell comprising the electrical conductive member according to claim 1,
wherein the electrical conductive layer in the electrical conductive member is located on an electrolyte side.

5. A polymer electrolyte fuel cell, comprising:
a membrane electrode assembly comprising
a polymer electrolyte membrane;
an anode catalyst layer and a cathode catalyst layer that interpose the polymer electrolyte membrane therebetween; and
an anode gas diffusion layer and a cathode gas diffusion layer that interpose the anode catalyst layer, the cathode catalyst layer and the polymer electrolyte membrane therebetween, and
an anode separator and a cathode separator that interpose the membrane electrode assembly therebetween,
wherein at least one of the anode separator and the cathode separator is the separator for the fuel cell according to claim 4.

6. The electrical conductive member according to claim 1, wherein the metal substrate comprises aluminum or aluminum alloy.

7. The electrical conductive member according to claim 1, wherein the at least one element is selected from the group consisting of boron, phosphorus, silicon, carbon and germanium.

8. The electrical conductive member according to claim 1, wherein:
the at least one element comprises a first element and a second element,
the first element is at least one element selected from the group consisting of helium, argon and krypton, and
the second element is at least one element selected from the group consisting of boron, phosphorus, silicon, carbon and germanium.

9. A method for manufacturing an electrical conductive member, comprising:
removing an oxide film on a surface of a metal substrate;
forming an intermediate layer on the metal substrate after removing the oxide film; and
forming an electrical conductive layer on the intermediate layer after forming the intermediate layer,
wherein the intermediate layer comprises a constituent of the metal substrate; a constituent of the electrical conductive layer; and at least one element selected from the group consisting of helium, argon, krypton, boron, phosphorus, silicon, carbon and germanium,
wherein the intermediate layer is formed by sputtering under a presence of the at least one element while a negative bias voltage of 100 V to 500 V is applied to the metal substrate, and
wherein the intermediate layer has a thickness of 30 nm to 200 nm.

10. The method for manufacturing an electrical conductive member according to claim 9, wherein the metal substrate is constituted by aluminum or an aluminum alloy.

11. The method for manufacturing an electrical conductive member according to claim 9, wherein
when the at least one element is selected from the group consisting of boron, phosphorus, silicon, carbon and germanium, the intermediate layer is formed by sputtering using the constituent of the electrical conductive layer and the at least one element that is selected from the group consisting of boron, phosphorus, silicon, carbon and germanium as targets.

12. The method for manufacturing an electrical conductive member according to claim 9, wherein the metal substrate comprises aluminum or aluminum alloy.

13. The method for manufacturing an electrical conductive member according to claim 9,
wherein the at least one element is selected from the group consisting of boron, phosphorus, silicon, carbon and germanium.

14. The method for manufacturing an electrical conductive member according to claim 9, wherein:
the at least one element comprises a first element and a second element,
the first element is at least one element selected from the group consisting of helium, argon and krypton, and
the second element is at least one element selected from the group consisting of boron, phosphorus, silicon, carbon and germanium.

* * * * *